United States Patent
Shibata

(10) Patent No.: US 10,381,555 B2
(45) Date of Patent: Aug. 13, 2019

(54) VARIABLE-FREQUENCY MAGNETORESISTIVE EFFECT ELEMENT AND OSCILLATOR, DETECTOR, AND FILTER USING THE SAME

(71) Applicant: TDK CORPORATION, Tokyo (JP)

(72) Inventor: Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 148 days.

(21) Appl. No.: 15/718,458

(22) Filed: Sep. 28, 2017

(65) Prior Publication Data

US 2018/0102475 A1 Apr. 12, 2018

(30) Foreign Application Priority Data

Oct. 6, 2016 (JP) .................................. 2016-197702

(51) Int. Cl.
*H03B 15/00* (2006.01)
*H01L 43/08* (2006.01)
(Continued)

(52) U.S. Cl.
CPC .............. *H01L 43/08* (2013.01); *G01R 33/09* (2013.01); *G01R 33/093* (2013.01); *G01R 33/098* (2013.01); *H01F 1/147* (2013.01); *H01F 10/002* (2013.01); *H01F 10/329* (2013.01); *H01F 10/3218* (2013.01); *H01L 43/02* (2013.01);
(Continued)

(58) Field of Classification Search
CPC .................................................... H03B 15/006
See application file for complete search history.

(56) References Cited

U.S. PATENT DOCUMENTS 7,473,478 B2   1/2009  Sbiaa et al.
7,719,883 B2   5/2010  Hochstrat et al.
(Continued)

FOREIGN PATENT DOCUMENTS

JP    2006-303097 A    11/2006
JP    4743113 B2        8/2011
WO    2010/119569 A1   10/2010

OTHER PUBLICATIONS

Witold Skowronski et al., "Spin-Torque Diode Radio-Frequency Detector With Voltage Tuned Rsonance" Applied Physics Letters, vol. 105, pp. 072409-1-072409-4, (2014).

*Primary Examiner* — Clayton E. LaBalle
*Assistant Examiner* — Jas A Sanghera
(74) *Attorney, Agent, or Firm* — Oliff PLC

(57) ABSTRACT

A variable-frequency magnetoresistive effect element includes a magnetoresistive effect element, a magnetic-field applying mechanism that applies a magnetic field to the magnetoresistive effect element, an electric-field applying mechanism that applies an electric field to the magnetoresistive effect element, and a control terminal connected to the electric-field applying mechanism and used for applying a voltage that varies in at least one of magnitude and polarity to the electric-field applying mechanism. The magnetoresistive effect element contains an antiferromagnetic material or ferrimagnetic material having a magnetoelectric effect. A spin torque oscillation frequency or spin torque resonance frequency of the magnetoresistive effect element is controlled by varying the voltage applied via the control terminal in at least one of magnitude and polarity.

15 Claims, 12 Drawing Sheets

(51) Int. Cl.
  *H01L 43/02* (2006.01)
  *H01L 43/10* (2006.01)
  *G01R 33/09* (2006.01)
  *H01F 10/00* (2006.01)
  *H01F 10/32* (2006.01)
  *H01F 1/147* (2006.01)
  *H03H 11/04* (2006.01)
  *H03H 2/00* (2006.01)

(52) U.S. Cl.
  CPC ........... *H01L 43/10* (2013.01); *H03B 15/006* (2013.01); *H03H 2/00* (2013.01); *H03H 11/04* (2013.01); *H01F 10/3286* (2013.01); *H03H 2/001* (2013.01)

(56) References Cited

U.S. PATENT DOCUMENTS

| | | |
|---|---|---|
| 8,766,629 B2 | 7/2014 | Maehara |
| 9,520,175 B2 | 12/2016 | Shibata et al. |
| 2007/0176519 A1 | 8/2007 | Sbiaa et al. |
| 2009/0067224 A1 | 3/2009 | Hochstrat et al. |
| 2010/0264959 A1 | 10/2010 | Maehara |
| 2015/0123755 A1* | 5/2015 | Shibata ............... H01F 10/3218 335/296 |

* cited by examiner

VARIABLE-FREQUENCY MAGNETORESISTIVE EFFECT ELEMENT AND OSCILLATOR, DETECTOR, AND FILTER USING THE SAME

BACKGROUND OF THE INVENTION

1. Field of the Invention

The present invention relates to an variable-frequency magnetoresistive effect element that uses the magnetoresistive effect and can be utilized in devices necessary for wireless communication such as an oscillator, a detector, and a filter.

2. Description of the Related Art

With the decreasing size and enhanced functionality of mobile terminals such as smartphones, the number of electronic components used in such mobile terminals and a space assigned to such electronic components are tending to decrease. In addition, due to the increasing communication speed and increasing variety of applications, the number of frequencies or frequency bands to be used is tending to increase. To meet these trends, there is a strong demand for multiband high-frequency components capable of controlling a plurality of frequency bands by themselves.

Oscillation (or resonance) elements that use the magnetoresistive effect are notably smaller than hitherto-used electric circuits such as LCR circuits but are capable of handling higher frequencies than such hitherto-used electric circuits. In addition, oscillation (or resonance) elements that use the magnetoresistive effect are capable of varying operating frequency in accordance with a magnetic field. Thus, the use of such oscillation (or resonance) elements as next-generation high-frequency components is anticipated (International Publication No. 2010/119569).

Hitherto-known oscillation (or resonance) frequency control means are roughly categorized into a magnetic-field-based control scheme and an electric-field-based control scheme. International Publication No. 2010/119569 and Japanese Patent No. 4743113 disclose a scheme in which an electromagnet is used as a magnetic-field applying mechanism for adjustment. In addition, Japanese Unexamined Patent Application Publication No. 2006-303097 discloses a specific structure of the magnetic-field-based control scheme that includes a magnetoresistive effect element, an electromagnet, and a magnetic-field guiding path used for applying a magnetic field from the electromagnet. According to this magnetic-field-based control scheme, the strength of the magnetic field is varied by varying the current flowing through a coil (electromagnet) to control the oscillation frequency. Further, W. Skowronski et al., Appl. Phys. Lett., 105, 072409 (2014) discloses a scheme in which an electric field is used as an external field. The electric-field-based control scheme is a technique of controlling frequency of spin precession by applying an electric field instead of a magnetic field.

SUMMARY OF THE INVENTION

However, according to an examination made by the inventor, these variable-frequency means of the related art have an issue in that they are desired to stably maintain the applied magnetic field or electric field without any fluctuation during a frequency control operation and are thus not suitable for use in devices. In addition, in the case where an electromagnet is used to generate a magnetic field for control, it is necessary to keep passing current through the coil to maintain an excited state in the electromagnet throughout the frequency control operation. This consequently causes an issue of greatly increased operation energy of the elements. Further, due to the necessity of disposing the electromagnet near an oscillation element, the assigned space tends to increase greatly as a whole. To address these issues, a mechanism that consumes energy only when the frequency is varied and is capable of maintaining the frequency-varied state without consuming energy is desired.

Embodiments of the present invention are made in view of the forgoing and address the aforementioned issues by implementing a mechanism capable of controlling frequency of spin precession in a magnetoresistive effect element by using an electric field that is substantially free from energy consumption and capable of maintaining the frequency-varied state even after the electric field is removed. Consequently, variable-frequency magnetoresistive effect elements having stable frequency characteristics and requiring notably less operation energy and devices using such variable-frequency magnetoresistive effect elements can be provided.

Specifically, a variable-frequency magnetoresistive effect element according to an aspect of the present invention includes a magnetoresistive effect element, a magnetic-field applying mechanism that applies a magnetic field to the magnetoresistive effect element, an electric-field applying mechanism that applies an electric field to the magnetoresistive effect element, and a control terminal connected to the electric-field applying mechanism and used for applying a voltage to the electric-field applying mechanism. The voltage varies in at least one of magnitude and polarity. The magnetoresistive effect element contains an antiferromagnetic material or ferrimagnetic material having a magnetoelectric effect. In such a case, a spin torque oscillation frequency or spin torque resonance frequency of the magnetoresistive effect element is controlled by varying the voltage applied via the control terminal in at least one of magnitude and polarity.

According to the above features of the aspect of the present invention, a spin torque oscillation effect can be caused in the magnetoresistive effect element in response to inputting of a DC signal to the magnetoresistive effect element from the input signal line. Owing to the spin torque oscillation effect, the magnetoresistive effect element is able to output an AC signal from the output signal line. Alternatively, a spin torque resonance effect can be caused in the magnetoresistive effect element in response to inputting of an AC signal to the magnetoresistive effect element from the input signal line. Owing to the spin torque resonance effect, an AC signal having a frequency equal to the spin torque resonance frequency of the magnetoresistive effect element in the input AC can be converted into a DC signal. Alternatively, owing to the spin torque resonance effect, element impedance can be reduced for an AC signal having a frequency equal to the spin torque resonance frequency of the magnetoresistive effect element in the input AC signal. The variable-frequency magnetoresistive effect element according to the aspect of the present invention is capable of varying oscillation frequency or resonance frequency of the magnetoresistive effect element by simultaneously applying a magnetic field and an electric field if necessary. At that time, the variable-frequency magnetoresistive effect element is capable of continuously controlling the oscillation frequency or the resonance frequency by varying the voltage applied via the control terminal or polarity of the applied voltage. Further, the variable-frequency magnetoresistive effect element is capable of maintaining the resulting state even after the electric field and the magnetic field are removed. As a result, the variable-frequency magnetoresistive effect element according to the aspect of the present invention is able to greatly reduce energy consumption of devices compared with the scheme in which the frequency is continuously varied by using a magnetic field. In addition, the variable-frequency magnetoresistive effect element according to the aspect of the present invention is capable of maintaining the resulting state without continuously applying a predetermined electric field compared with the scheme in which the frequency is continuously varied by using an electric field. Therefore, the variable-frequency magnetoresistive effect element according to the aspect of the present invention is able to implement frequency control with stabilized frequency fluctuation and less energy consumption.

In the variable-frequency magnetoresistive effect element according to the aspect of the present invention, the magnetoresistive effect element may be structured to include a control layer and a magnetization free layer that is magnetically connected to the control layer and in which direction of magnetization is variable. In such a case, the control layer may contain the antiferromagnetic material or the ferrimagnetic material.

According to the variable-frequency magnetoresistive effect element having the above features, with such a structure, the frequency of spin torque oscillation or spin torque resonance that is effectively caused in the magnetization free layer in response to application of the electric field and the magnetic field can be varied and the resulting state can be maintained. Consequently, a variable-frequency magnetoresistive effect element capable of effectively varying the frequency can be provided.

In the variable-frequency magnetoresistive effect element according to the aspect of the present invention, the control layer may further contain another antiferromagnetic material having a Neel temperature that is higher than a Neel temperature of the antiferromagnetic material or the ferrimagnetic material.

According to the variable-frequency magnetoresistive effect element having the above features, the thermal/temporal stability of exchange coupling caused between the control layer and the magnetization free layer can be increased.

The variable-frequency magnetoresistive effect element according to the aspect of the present invention may further include a control mechanism connected to the control terminal and having a function of controlling the voltage applied via the control terminal and polarity of the voltage.

According to the variable-frequency magnetoresistive effect element having the above features, since the variable-frequency magnetoresistive effect element includes such a control mechanism, frequency control can be performed without external connection of a power supply to the control terminal to perform voltage control. Consequently, a simpler variable-frequency magnetoresistive effect element capable of actively controlling the frequency can be provided.

The variable-frequency magnetoresistive effect element according to the aspect of the present invention may further include a feedback circuit that detects at least one of an input signal and an output signal of the magnetoresistive effect element and provides a feedback to the control mechanism to achieve a desired spin torque oscillation frequency or a desired spin torque resonance frequency.

According to the variable-frequency magnetoresistive effect element having the above features, since the variable-frequency magnetoresistive effect element includes such a feedback circuit, even if the frequency fluctuates due to a change in the magnetic field applied from the outside or a temperature change, the fluctuation can be cancelled by re-adjustment. Consequently, a variable-frequency magnetoresistive effect element that is robust to a disturbance caused by an external field can be provided.

In the variable-frequency magnetoresistive effect element according to the aspect of the present invention, a permanent magnet may be used for the magnetic-field applying mechanism.

According to the variable-frequency magnetoresistive effect element having the above features, the magnetic field necessary for frequency control can be applied without energy consumption. Consequently, energy necessary for control can be further reduced. As a result, a variable-frequency magnetoresistive effect element that consumes less energy can be provided.

In the variable-frequency magnetoresistive effect element according to the aspect of the present invention, (1) the magnetization free layer may have magnetic anisotropy in an in-plane direction, (2) a magnetic field may be applied by the magnetic-field applying mechanism to the control layer in a direction perpendicular to a stacking direction of the magnetoresistive effect element, (3) an electric field may be applied by the electric-field applying mechanism to the control layer in a direction perpendicular to the stacking direction of the magnetoresistive effect element, (4) the magnetic field and the electric field may be superposed and applied to the control layer so as to have a substantially parallel relationship or a substantially antiparallel relationship, and (5) the spin torque oscillation frequency or the spin torque resonance frequency of the magnetoresistive effect element may be varied by varying magnitude or direction of the applied electric field. Here, the term "direction perpendicular to the stacking direction" refers to, in the case where an axis perpendicular to the stacking direction of the magnetoresistive effect element is assumed, a substantially perpendicular direction within a range of ±10° from the axis. Note that the direction perpendicular to the stacking direction may be in any stack in-plane direction of the magnetoresistive effect element.

According to the variable-frequency magnetoresistive effect element having the above features, as a result of the magnetization free layer having such magnetic anisotropy, spin precession in the magnetization free layer can be effectively reflected in a change in magnetoresistance. As a result, the oscillation efficiency or resonance efficiency of the magnetoresistive effect element can be improved, and the oscillation effect or resonance effect can be effectively used. In addition, the effective magnetic field can be applied to the magnetization free layer from the control layer in the in-plane direction, and the oscillation frequency or resonance frequency can be effectively varied by varying the electric field.

In the variable-frequency magnetoresistive effect element according to the aspect of the present invention, (1) the magnetization free layer may have magnetic anisotropy in an in-plane direction, (2) a magnetic field may be applied by the magnetic-field applying mechanism to the control layer so as to include a component of a stacking direction of the magnetoresistive effect element, (3) an electric field may be applied by the electric-field applying mechanism to the control layer so as to include a component of the stacking direction of the magnetoresistive effect element, (4) the magnetic field and the electric field may be superposed and applied to the control layer so as to have a substantially parallel relationship or a substantially antiparallel relationship, and (5) the spin torque oscillation frequency or the spin torque resonance frequency may be varied by varying magnitude or direction of the applied electric field.

According to the variable-frequency magnetoresistive effect element having the above features, as a result of the magnetization free layer having such magnetic anisotropy, spin precession in the magnetization free layer can be effectively reflected in a change in magnetoresistance. As a result, the oscillation efficiency or resonance efficiency of the magnetoresistive effect element can be improved, and the oscillation effect or resonance effect can be effectively used. In addition, the effective magnetic field can be applied to the magnetization free layer from the control layer in the stacking direction, and the oscillation frequency or resonance frequency can be effectively varied by varying the electric field.

In the variable-frequency magnetoresistive effect element according to the aspect of the present invention, (1) the magnetization free layer may have magnetic anisotropy in a direction perpendicular to a stacking plane, (2) a magnetic field may be applied by the magnetic-field applying mechanism to the control layer so as to include a component of the stacking direction of the magnetoresistive effect element, (3) an electric field may be applied by the electric-field applying mechanism to the control layer so as to include a component of the stacking direction of the magnetoresistive effect element, (4) the magnetic field and the electric field may be superposed and applied to the control layer so as to have a substantially parallel relationship or a substantially antiparallel relationship, and (5) the spin torque oscillation frequency or the spin torque resonance frequency may be varied by varying magnitude or direction of the applied electric field.

According to the variable-frequency magnetoresistive effect element having the above features, as a result of the magnetization free layer having such magnetic anisotropy, spin precession in the magnetization free layer can be effectively reflected in a change in magnetoresistance. As a result, the oscillation efficiency or resonance efficiency of the magnetoresistive effect element can be improved, and the oscillation effect or resonance effect can be effectively used. In addition, the effective magnetic field can be applied to the magnetization free layer from the control layer in the stacking direction, and the oscillation frequency or resonance frequency can be effectively varied by varying the electric field.

In the variable-frequency magnetoresistive effect element according to the aspect of the present invention, the magnetoresistive effect element may contain, as the antiferromagnetic material, at least one oxide from among $Cr_2O_3$, $YMnO_3$, and $BiFeO_3$.

According to the variable-frequency magnetoresistive effect element having the above features, by the use of these materials for the control layer, the strength of the electric field necessary for frequency control can be reduced. In addition, insulation of the control layer can be enhanced. As a result, leakage current of the control layer can be suppressed low, and a variable-frequency magnetoresistive effect element with lower energy consumption can be provided.

In the variable-frequency magnetoresistive effect element according to the aspect of the present invention, the magnetoresistive effect element may contain, as the ferrimagnetic material, $Al_{1-x-y}Ga_xFe_{1+y}O_3$ (where $0 \le x \le 1$, $0 \le y \le 0.3$, and $0 \le x+y \le 1$).

According to the variable-frequency magnetoresistive effect element having the above features, the strength of the electric field necessary for frequency control can be reduced. In addition, insulation of the control layer can be enhanced. As a result, leakage current of the control layer can be suppressed low, and a variable-frequency magnetoresistive effect element with lower energy consumption can be provided.

The variable-frequency magnetoresistive effect element according to the aspect of the present invention can be used in a variable-frequency oscillator. This variable-frequency oscillator has features in that (1) the variable-frequency oscillator includes the above-described variable-frequency magnetoresistive effect element, (2) the magnetoresistive effect element of the variable-frequency magnetoresistive effect element receives an input DC signal and outputs an AC signal having a frequency equal to a frequency of spin precession, and (3) a frequency of the AC signal output from the magnetoresistive effect element is varied by varying magnitude or direction of the electric field applied to the magnetoresistive effect element.

According to the variable-frequency oscillator having the above features, a spin torque oscillation effect can be caused in the magnetoresistive effect element in response to inputting of a DC signal to the magnetoresistive effect element. Owing to the spin torque oscillation effect, the magnetoresistive effect element can output an AC signal having a frequency equal to the frequency of spin precession in the magnetization free layer from the output signal line. At that time, the oscillation frequency of the magnetoresistive effect element can be varied by varying the strength or direction of the applied electric field. Further, the resulting state can be maintained even after the electric field and the magnetic field are removed. Thus, the variable-frequency oscillator having the above features can greatly reduce the device energy consumption, compared with hitherto-used oscillators that use a magnetoresistive effect element based on a scheme in which the oscillation frequency is continuously varied using an electromagnet.

The variable-frequency magnetoresistive effect element according to the aspect of the present invention can be used in a variable-frequency detector. This variable-frequency detector has features in that (1) the variable-frequency detector includes the above-described variable-frequency magnetoresistive effect element, (2) the magnetoresistive effect element of the variable-frequency magnetoresistive effect element receives an input AC signal and outputs a DC signal in response to a signal having a frequency equal to a frequency of spin precession in the input AC signal, and (3) the "frequency of spin precession", that is, a detectable frequency, is the spin torque resonance frequency of the magnetization free layer and is varied by varying magnitude or direction of the applied electric field.

According to the variable-frequency detector having the above features, a spin torque resonance effect is caused in the magnetoresistive effect element in response to inputting of an AC signal to the magnetoresistive effect element. Owing to the spin torque resonance effect, the magnetoresistive effect element can convert an AC signal having a frequency equal to the frequency of spin precession in the magnetization free layer in the input AC signal into a DC signal. At that time, the response frequency of the magnetoresistive effect element can be varied by varying the strength or direction of the applied electric field. Further, the resulting state can be maintained even after the electric field and the magnetic field are removed. Thus, the variable-frequency detector can greatly reduce the device energy consumption, compared with hitherto-used detectors that use a magnetoresistive effect element based on a scheme in which the resonance frequency is continuously varied using an electromagnet.

The variable-frequency magnetoresistive effect element according to the aspect of the present invention can be used in a variable-frequency filter. This variable-frequency filter has features in that (1) the variable-frequency filter includes the above-described variable-frequency magnetoresistive effect element, (2) upon receiving an input AC signal, the magnetoresistive effect element of the variable-frequency magnetoresistive effect element outputs an AC signal obtained by selectively attenuating a component having a frequency equal to a frequency of spin precession (the spin torque resonance frequency of the magnetization free layer) in the input AC signal, and (3) the frequency of the attenuated signal (the spin torque resonance frequency of the magnetization free layer) is varied by varying magnitude or direction of the applied electric field.

According to the variable-frequency filter having the above features, a spin torque resonance effect can be caused in the magnetoresistive effect element in response to inputting of an AC signal to the magnetoresistive effect element. At that time, the magnetoresistive effect element can be handled as an element whose resistance periodically varies at a frequency corresponding to the spin torque resonance frequency. Owing to this effect, element impedance reduces at the frequency equal to the spin torque resonance frequency of the magnetoresistive effect element. By connecting this magnetoresistive effect element in parallel to the input signal line and the output signal line, the AC signal having frequencies near the spin torque resonance frequency of the magnetoresistive effect element in the AC signal input from the input signal line more easily flows into the magnetoresistive effect element and is less likely to flow into the output signal line. That is, the AC signal input from the input signal line can be attenuated at frequencies near the spin torque resonance frequency of the magnetoresistive effect element before the output signal line. As a result, the variable-frequency filter having the above features can have a function of a filter that attenuates an AC signal having a frequency equal to the frequency of spin precession. At that time, the frequency attenuated by the magnetoresistive effect element can be varied by varying the strength or direction of the applied electric field. Further, the resulting state can be maintained even after the electric field and the magnetic field are removed. Thus, the variable-frequency filter having the above features can greatly reduce the device energy consumption, compared with hitherto-used filters that use a magnetoresistive effect element based on a scheme in which the resonance frequency is continuously varied using an electromagnet.

Further, a variable-frequency filter according to an aspect of the present invention may have features in that (1) the variable-frequency filter includes the above-described variable-frequency magnetoresistive effect element, (2) upon receiving an input AC signal, the magnetoresistive effect element of the variable-frequency magnetoresistive effect element passes therethrough an AC signal having a frequency equal to a frequency of spin precession (the spin torque resonance frequency of the magnetization free layer) in the input AC signal, and (3) the frequency of the AC signal that is passed through (the spin torque resonance frequency of the magnetization free layer) is varied by varying magnitude or direction of the applied electric field.

According to the variable-frequency filter having the above features, a spin torque resonance effect can be caused in the magnetoresistive effect element in response to inputting of an AC signal to the magnetoresistive effect element. At that time, the magnetoresistive effect element can be handled as an element whose resistance periodically varies at a frequency corresponding to the spin torque resonance frequency. Owing to this effect, element impedance reduces at the frequency equal to the spin torque resonance frequency of the magnetoresistive effect element. By connecting this magnetoresistive effect element in series to the input signal line and the output signal line, the AC signal can be cut off at non-resonance frequencies where impedance is high and can be passed through the resonance frequency where impedance is low. As a result, the variable-frequency filter having the above features can have a function of a filter that passes therethrough an AC signal of a frequency equal to the frequency of spin precession. At that time, the pass frequency of the magnetoresistive effect element can be varied by varying the strength or direction of the applied electric field. Further, the resulting state can be maintained even after the electric field and the magnetic field are removed. Thus, the variable-frequency filter having the above features can greatly reduce the device energy consumption, compared with hitherto-used filters that use a magnetoresistive effect element based on a scheme in which the resonance frequency is continuously varied using an electromagnet.

According to aspects of the present invention, a variable-frequency magnetoresistive effect element capable of greatly reducing operation energy used for frequency control and of maintaining the resulting frequency can be provided. In addition, an energy-efficient variable-frequency oscillator, detector, and filter using such a variable-frequency magnetoresistive effect element can be provided.

DESCRIPTION OF THE PREFERRED EMBODIMENTS

Exemplary embodiments of the present invention will be described below with reference to the drawings. Note that the following description shows some of embodiments of the present invention by way of example. Thus, the present invention is not limited to these embodiments, and any embodiments having the technical spirit of the present invention are also within the scope of the present invention. Configurations and a combination of those configurations in each embodiment are merely an example, and thus addition, omission, replacement, and other modifications of a configuration can be made within a range not departing from the essence of the present invention.

First Embodiment

Figure 1:
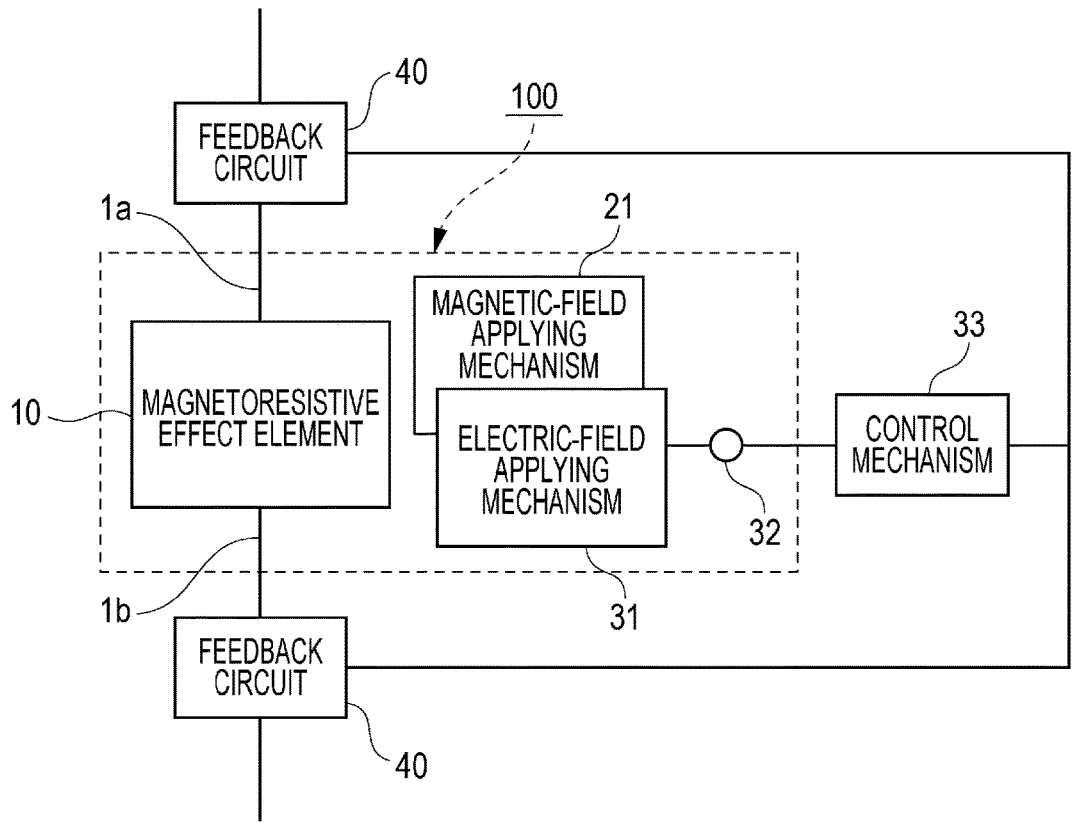
FIG. 1 is a schematic diagram illustrating a configuration of a variable-frequency magnetoresistive effect element according to a first embodiment.

FIG. 1 is a schematic diagram illustrating a configuration of a variable-frequency magnetoresistive effect element 100 according to a first embodiment of the present invention. The variable-frequency magnetoresistive effect element 100 includes a magnetoresistive effect element 10, a magnetic-field applying mechanism 21, an electric-field applying mechanism 31, and a control terminal 32. An input signal line 1a and an output signal line 1b are connected to the magnetoresistive effect element 10. The input signal line 1a and the output signal line 1b respectively allow an input signal and an output signal to flow therethrough. The control terminal 32 is connected to the electric-field applying mechanism 31. By applying a positive or negative voltage to the electric-field applying mechanism 31 via the control terminal 32, an electric field having a predetermined magnitude and a predetermined direction can be applied to the magnetoresistive effect element 10 via the electric-field applying mechanism 31. Although the magnetic-field applying mechanism 21 includes an electromagnet using a coil or a permanent magnet in this embodiment, the magnetic-field applying mechanism 21 is not limited to this mechanism as long as the magnetic-field applying mechanism 21 is capable of applying a magnetic field to the magnetoresistive effect element 10. In addition, although the electric-field applying mechanism 31 can be directly connected to the magnetoresistive effect element 10, the electric-field applying mechanism 31 is not limited to this mechanism as long as the electric-field applying mechanism 31 is capable of applying an electric field to the magnetoresistive effect element 10.

The variable-frequency magnetoresistive effect element 100 can further include a control mechanism 33 connected to the control terminal 32, and feedback circuits 40 connected to the control mechanism 33. By including the control mechanism 33 and the feedback circuits 40, the variable-frequency magnetoresistive effect element 100 is capable of actively varying the frequency in accordance with a control signal input from the outside. In addition, by including the feedback circuits 40, the variable-frequency magnetoresistive effect element 100 is capable of automatically correcting the frequency of the spin torque oscillation or resonance effect to the target value all the time even if the input or output frequency varies. Consequently, the variable-frequency magnetoresistive effect element 100 is capable of performing stable and effective frequency control.

Now, functions of the variable-frequency magnetoresistive effect element 100 are described by using the first embodiment as an example. The variable-frequency magnetoresistive effect element 100 has a function of causing spin precession having a component of a frequency $f_0$ in the magnetoresistive effect element 10 upon receiving a DC (direct-current) signal from the input signal line 1a and of outputting an AC (alternating-current) signal having the component of the frequency $f_0$ from the output signal line 1b. The variable-frequency magnetoresistive effect element 100 also has a function of causing a spin torque resonance effect in the magnetoresistive effect element 10 upon receiving an AC signal having the component of the frequency $f_0$ from the input signal line 1a and of outputting a DC signal. The variable-frequency magnetoresistive effect element 100 further has a function of outputting, upon receiving an AC signal including a first frequency component having at least the frequency $f_0$ that causes the spin torque resonance effect and a second frequency component different from the first frequency component, an AC signal obtained by attenuating the signal component having the frequency $f_0$ in the input AC signal owing to the spin torque resonance effect. Moreover, the variable-frequency magnetoresistive effect element 100 has a function of outputting, upon receiving an AC signal including a first frequency component having at least the frequency $f_0$ that causes the spin torque resonance effect and a second frequency component different from the first frequency component, an AC signal obtained by passing the signal component having the frequency $f_0$ in the input AC signal owing to the spin torque resonance effect.

A frequency control method is described next by using the first embodiment as an example. The first embodiment discloses a technique of controlling the frequency of spin precession in the magnetoresistive effect element 10 by simultaneously applying a magnetic field and an electric field to the magnetoresistive effect element 10. The expression "simultaneously applying a magnetic field and an electric field" refers to a state where a magnetic field and an electric field are superposed (superposed state) is temporarily created for the magnetoresistive effect element 10. In addition, in this specification, the term "magnetoelectric (ME) manipulation" is defined as "a technique of manipulating the frequency of spin precession in the magnetoresistive effect element 10 by causing superposition of a magnetic field and an electric field for the magnetoresistive effect element 10 and controlling magnitude and/or direction of at least one of the electric field and the magnetic field".

Figure 2:
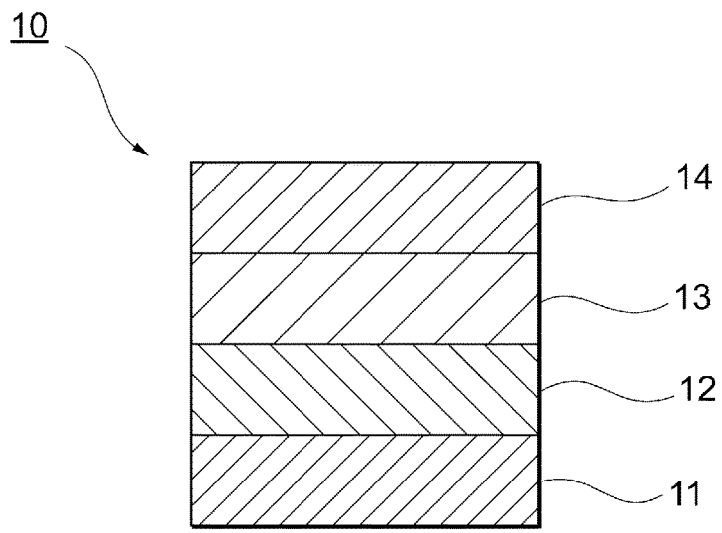
FIG. 2 is a schematic diagram illustrating a configuration of a magnetoresistive effect element according to the first embodiment.

FIG. 2 is a schematic diagram illustrating a specific configuration of the magnetoresistive effect element 10 according to the first embodiment of the present invention. The magnetoresistive effect element 10 includes a control layer 11, a magnetization free layer 12, an intermediate layer 13, and a magnetization fixed layer 14. The control layer 11 has a function of controlling the frequency of spin precession in the magnetization free layer 12.

The control layer 11 is described by using the first embodiment as an example. The control layer 11 contains mainly an antiferromagnetic material or ferrimagnetic material having a magnetoelectric effect (ME effect). The control layer 11 is magnetically connected to the magnetization free layer 12 via exchange coupling and has a function of varying the frequency of spin precession in the magnetization free layer 12 in response to ME manipulation. The control layer 11 may preferably have properties, such as having large electric and magnetic coupling coefficients and being capable of producing sufficiently strong exchanging coupling with the magnetization free layer 12 in a wide temperature range. These properties can be achieved by using a single material having the magnetoelectric effect and having good properties. Alternatively, these properties may be achieved by using a composite material obtained by combining an antiferromagnetic material having the magnetoelectric effect and another antiferromagnetic material having a higher Neel temperature. In this case, the thermal/temporal stability of exchange coupling caused between the control layer 11 and the magnetization free layer 12 tends to increase. Such a composite material is adjustable in terms of the structure of the materials, the thickness of the layer, and the magnetic characteristics (such as anisotropy energy and Neel temperature of the antiferromagnetic materials) so that the value of exchange coupling can be maximized in a predetermined temperature range. In the first embodiment, a ferrimagnetic material having the magnetoelectric effect can be used in place of the antiferromagnetic material having the magnetoelectric effect because these two materials have similar properties when being classified based on the spin arrangement.

The control layer 11 may be composed of (a) a thin-film material containing at least one of an antiferromagnetic oxide material having the magnetoelectric effect, such as $Cr_2O_3$ or $BiFeO_3$, or a ferrimagnetic oxide material having the magnetoelectric effect, such as $Al_{1-x-y}Ga_xFe_{1+y}O_3$ ($0 \le x \le 1$, $0 \le y \le 0.3$, $0 \le x+y \le 1$). Alternatively, the control layer 11 may be composed of (b) a mixed crystal mainly containing at least one of an antiferromagnetic oxide material having the magnetoelectric effect, such as $Cr_2O_3$ or $BiFeO_3$, or a ferrimagnetic oxide material having the magnetoelectric effect, such as $Al_{1-x-y}Ga_xFe_{1-y}O_3$ ($0 \le x \le 1$, $0 \le y \le 0.3$, $0 \le x+y \le 1$). Alternatively, the control layer 11 may be composed of (c) a composite material (stack or mixture) of at least one of an antiferromagnetic oxide material having the magnetoelectric effect and a ferrimagnetic oxide material having the magnetoelectric effect and an antiferromagnetic material having a Neel temperature higher than that of the antiferromagnetic oxide material or ferrimagnetic oxide material having the magnetoelectric effect. As the antiferromagnetic material, a known antiferromagnetic material having a high Neel temperature can be appropriately selected. Typically, an antiferromagnetic oxide material such as $Fe_2O_3$, $(1-x)Fe_2O_{3-x}Rh_2O_3$, $(1-x)Fe_2O_{3-x}RuO_2$, $(1-x)Fe_2O_{3-x}IrO_2$ (where $0<x<1$) can be used. Thickness of the control layer 11 is not particularly limited as long as the control layer 11 is capable of producing exchange coupling with the magnetization free layer 12. However, the thickness of the control layer 11 is desirably 1 nm to 1 μm in view of requirements that an electric field can be applied to the control layer 11 without causing dielectric breakdown and a voltage applied to the control layer 11 is suppressed low.

The magnetization free layer 12 is described by using the first embodiment as an example. The magnetization free layer 12 contains mainly a ferromagnetic metal magnetically connected to the control layer 11 via exchange coupling. The magnetization free layer 12 is a layer in which the direction of magnetization varies depending on an externally applied magnetic field or spin polarized current. In the case where the magnetization free layer 12 is composed of a material having a magnetic easy axis in an in-plane direction, the material may be, for example, CoFe, CoFeB, CoFeSi, CoFeMnSi, CoMnGe, CoMnSi, or CoMnAl. The magnetization free layer 12 preferably has a thickness of approximately 1 nm to 10 nm in this case. In the case where the magnetization free layer 12 is composed of a material having perpendicular magnetic anisotropy, the material may be, for example, Co, a CoCr-based alloy, a Co multilayer film, a CoCrPt-based alloy, an FePt-based alloy, an SmCo-based alloy including rare earth, a TbFeCo alloy, or a Heusler alloy such as MnGa or MnGe. Alternatively, for example, if an oxide material is used in the intermediate layer 13 in the case where the magnetization free layer 12 has perpendicular magnetic anisotropy, the magnetization free layer 12 can use, in addition to the properties of the material, interface perpendicular magnetic anisotropy that occurs at an interface between a ferromagnetic material and an oxide. The combination of this case may be, for example, Fe and MgO, CoFeB and MgO, or a Co-based Heusler alloy and MgO, and the thickness is preferably set to approximately 1 nm to 10 nm in this case.

An exchange coupling buffer layer may be interposed between the magnetization free layer 12 and the control layer 11. With the exchange coupling buffer layer, the strength of exchange coupling becomes adjustable. In the exchange coupling buffer layer, for example, transition metal elements such as Ru, Pt, Pd, and Cr excluding ferromagnetic metals, light metals such as Al and Mg, and semiconductor elements such as Si can be suitably used. Film thickness of the exchange coupling buffer layer can be set to any given value as long as magnetic connection between the magnetization free layer 12 and the control layer 11 is maintained. In view of appropriate adjustment of the strength of exchange coupling, the film thickness is preferably set to approximately 0.1 nm to 1.0 nm.

A material having a large MR effect may be interposed between the magnetization free layer 12 and the intermediate layer 13. With the material having the large MR effect, a higher magnetoresistance ratio can be achieved. The material having a large MR effect is, for example, a CoFe ally or a CoFeB alloy. Film thickness of both the CoFe alloy and the CoFeB alloy is preferably set to approximately 0.2 nm to 1.0 nm.

The intermediate layer 13 is described by using the first embodiment as an example. The intermediate layer 13 is disposed between the magnetization free layer 12 and the magnetization fixed layer 14 and has a function of causing magnetization of the magnetization free layer 12 and magnetization of the magnetization fixed layer 14 to interact with each other to cause the magnetoresistive effect. The intermediate layer 13 is a layer composed of a conductive material, an insulating material, or a semiconductor material or a layer in which a current flow point composed of a conductor is included in an insulator.

In the case where a non-magnetic metal is used for the intermediate layer 13, the non-magnetic metal may be Cu, Ag, Au, or Ru. In this case, a giant magnetoresistive (GMR) effect occurs in the magnetoresistive effect element 10. When the GMR effect is used, the intermediate layer 13 preferably has a film thickness of approximately 0.5 nm to 3.0 nm.

In the case where an insulating material is used for the intermediate layer 13, the insulating material may be $Al_2O_3$, MgO, or a spinel-group oxide such as $MgAl_2O_4$. In this case, a tunnel magnetoresistive (TMR) effect occurs in the magnetoresistive effect element 10. By adjusting the crystal structure, orientation, and film thickness of the intermediate layer 13 so that a coherent tunnel effect occurs between the magnetization free layer 12 and the magnetization fixed layer 14, a high magnetoresistance ratio can be achieved. When the TMR effect is used, the intermediate layer 13 preferably has a film thickness of approximately 0.5 nm to 3.0 nm.

In the case where a semiconductor material is used for the intermediate layer 13, the semiconductor material may be ZnO, $In_2O_3$, $SnO_2$, ITO, $GaO_x$, or $Ga_2O_x$. The intermediate layer 13 preferably has a film thickness of approximately 1.0 nm to 4.0 nm.

In the case where a layer in which the current flow point composed of a conductor is included in a insulator is used for the intermediate layer 13, the intermediate layer 13 preferably has a structure in which the current flow point composed of a conductor, such as CoFe, CoFeB, CoFeSi, CoMnGe, CoMnSi, CoMnAl, Fe, Co, Au, Cu, Al, or Mg, is included in an insulator, such as $Al_2O_3$ or MgO. In this case, the intermediate layer 13 preferably has a film thickness of approximately 0.5 nm to 2.0 nm.

The magnetization fixed layer 14 is composed of a ferromagnetic material, and the magnetization direction of the magnetization fixed layer 14 is substantially fixed to one direction. The magnetization fixed layer 14 is preferably composed of a material having high spin polarizability, such as Fe, Co, Ni, an alloy of Ni and Fe, an alloy of Fe and Co, or an ally of Fe, Co, and B. With the material having high spin polarizability, a high magnetoresistance ratio can be achieved. The magnetization fixed layer 14 preferably has a film thickness of 1 nm to 10 nm. An antiferromagnetic layer may be added so as to be in contact with the magnetization fixed layer 14 in order to fix magnetization of the magnetization fixed layer 14. Alternatively, magnetization of the magnetization fixed layer 14 may be fixed using the magnetic anisotropy resulting from the crystal structure or the shape, for example. The antiferromagnetic layer may be composed of FeO, CoO, NiO, $CuFeS_2$, IrMn, FeMn, PtMn, Cr, or Mn.

In the case where the magnetoresistive effect element 10 has a rectangular shape (including a square shape), the magnetoresistive effect element 10 desirably has long sides of approximately 100 nm or of 100 nm or less. In the case where the magnetoresistive effect element 10 does not have a rectangular shape, the long sides of a rectangle circumscribed around the shape of the magnetoresistive effect element 10 with a minimum area are defined as the long sides of the magnetoresistive effect element 10. When the long sides of the magnetoresistive effect element 10 are short, for example, approximately 100 nm, the magnetization free layer 12 can have a single magnetic domain and efficient spin precession is realized.

A spin torque oscillation effect and a spin torque resonance effect that use a spin precession phenomenon is described next by using the first embodiment as an example.

When DC flows through the magnetoresistive effect element, electrons spin-polarized in the magnetization fixed layer flow into the magnetization free layer. Consequently, spin torque is transferred and spin precession is induced in the magnetization free layer. At that time, an AC signal having a frequency corresponding to a period of the spin precession is output from the magnetoresistive effect element. This phenomenon is called spin torque oscillation effect. It is generally known that the frequency of the spin torque oscillation effect is variable by using an externally applied magnetic field.

On the other hand, when an AC signal having a frequency equal to the frequency of spin precession in the magnetoresistive effect element is input to the magnetoresistive effect element, the spin precession can be induced in the magnetization free layer. This phenomenon is called spin torque resonance effect. It is generally known that the frequency of the spin torque resonance effect is variable by using an externally applied magnetic field. In the spin torque resonance state, a DC voltage that is proportional to the square of an amplitude of the input AC signal is generated in the magnetoresistive effect element. An effect using this rectifying action is particularly called spin torque diode effect. The DC voltage output as a result of the spin toque diode effect increases in proportion to the magnetoresistance ratio of the magnetoresistive effect element. Alternatively, the magnetoresistive effect element can be handled as an element whose resistance periodically varies at a frequency corresponding to the spin torque resonance frequency. At that time, element impedance of the magnetoresistive effect element decreases at frequencies near the spin torque resonance frequency. The use of this characteristic makes it easier for high-frequency signals having frequencies near the spin torque resonance frequency to pass through the magnetoresistive effect element.

Thus, the variable-frequency magnetoresistive effect element 100 is capable of causing the spin torque oscillation effect in the magnetoresistive effect element 10 by inputting a DC to the magnetoresistive effect element 10 from the input signal line 1a and of outputting an AC signal having a frequency corresponding to the period of spin precession from the output signal line 1b. In addition, this oscillation frequency can be varied by magnetoelectric manipulation in which a magnetic field applied by the magnetic-field applying mechanism 21 and an electric field applied by the electric-field applying mechanism 31 are used. In such a case, the variable-frequency magnetoresistive effect element 100 can be used as a high-frequency-band-adaptive variable-frequency oscillator, applications of which to communication devices, IC tags, and vehicle-mounted radars are anticipated.

In addition, by using the spin torque resonance effect, the variable-frequency magnetoresistive effect element 100 is capable of converting, into a DC voltage, a frequency component equal to the frequency of spin precession in the magnetoresistive effect element 10 from among frequency components of an AC signal input to the magnetoresistive effect element 10 from the input signal line 1a. Alternatively, the variable-frequency magnetoresistive effect element 100 is capable of reducing element impedance near the frequency equal to the frequency of spin precession in the magnetoresistive effect element 10 among frequency components of the input AC signal. In the case of outputting a DC signal from the output signal line 1b, the variable-frequency magnetoresistive effect element 100 is usable as a variable-frequency detector adaptive to a high-frequency band. On the other hand, in the case of outputting an AC signal from the output signal line 1b, the variable-frequency magnetoresistive effect element 100 is capable of outputting a high-frequency signal obtained by attenuating or passing therethrough a frequency component of the input AC signal that is equal to the resonance frequency of spin precession in the magnetoresistive effect element 10. Thus, the variable-frequency magnetoresistive effect element 100 can be used as a variable-frequency band elimination filter that attenuates an AC signal having the resonance frequency of spin precession in the magnetoresistive effect element 10 or a variable-frequency bandpass filter that passes an AC signal having the resonance frequency of spin precession in the magnetoresistive effect element 10.

The principle of frequency control is described next by using the first embodiment as an example. Spin dynamics, typically, spin precession, can be represented by the Landau-Lifshitz-Gilbert (LLG) equation, which is an equation of motion of magnetization. In general, some kind of torque affects the magnetic moment oriented in the direction of the magnetic field, the magnetic moment starts precession. The presence of an effective magnetic field ($H_{eff}$) that affects each spin of a ferromagnetic material and a spin-transfer torque are known as torques that cause such dynamics. The spin precession caused in response to application of a torque relaxes after a while to the ground state again while dissipating the energy. At that time, if supply of energy having a frequency equal to the natural frequency of the system is continued, the spin precession is continued. The spin torque oscillation effect or the spin torque resonance effect uses this phenomenon. Equation 1 is the LLG equation in which the spin-transfer torque is taken into account.

$$\frac{dM_2}{dt} = -|\gamma|(M_2 \times H_{eff}) + \alpha m_2 \times \frac{\partial M_2}{\partial t} + g\frac{\hbar}{2}\frac{I_e}{e}m_2 \times (m_2 \times m_1) \qquad \text{Equation 1}$$

A system including two ferromagnetic electrodes is assumed here. Electrons flow from a ferromagnetic electrode (FM1), which serves as the magnetization fixed layer, to another ferromagnetic electrode (FM2), which serves as the magnetization free layer, to transfer the spin angular momentum and affect magnetization of the magnetization free layer. In Equation 1, $M_2$ represents a magnetization vector at the ferromagnetic electrode FM2. The first term of the right side represents a torque based on the effective magnetic field $H_{eff}$ ($\gamma$ is a gyromagnetic ratio), and the second term of the right side represents a damping term representing damping against the rotational precession of magnetization and is a phenomenological term introduced to express the relaxing process of magnetization. In the case of $\alpha \neq 0$, the precession of magnetization relaxes and converges towards the direction of the effective magnetic field. The third term of the right side is a term based on the spin-transfer torque. The effective magnetic field $H_{eff}$ is constituted by an external magnetic field ($H_E$), an anisotropic magnetic field ($H_K$), and a demagnetizing field ($H_D$) based on magnetization, as represented by Equation 2.

$$H_{eff} = H_E + H_K + H_D \qquad \text{Equation 2}$$

It is known that the frequency of spin precession at that time can be represented by the Kittel formula and varies depending on the effective magnetic field. For example, the resonance frequency of the ferromagnetic material can be represented by Equation 3 in a system having a magnetic easy axis in an in-plane direction.

$$f = \frac{\gamma}{2\pi}\sqrt{\frac{M_s H_{eff}}{\mu_0}} \qquad \text{Equation 3}$$

Since the terms of the demagnetizing field $H_D$ and the anisotropic magnetic field $H_K$ of the effective magnetic field $H_{eff}$ are determined depending on the material and the element shape, a means for actively varying the frequency by using the external magnetic field $H_E$ is generally employed.

Now, the case is considered where a ferromagnetic material having spin precession is adjacent to an antiferromagnetic material. In this case, the effective magnetic field can include, as an effective component, an exchange bias magnetic field ($H_{EB}$) based on exchange coupling caused at an interface between the ferromagnetic material and the antiferromagnetic material in addition to the external magnetic field, the anisotropic magnetic field, and the demagnetizing field described above (Equation 4).

$$H_{eff} = H_E + H_K + H_D + H_{EB} \qquad \text{Equation 4}$$

Thus, if the exchange bias magnetic field caused at the interface between the ferromagnetic material and the antiferromagnetic material can be varied by using an external field, the frequency of spin precession can be varied as in the case where the external magnetic field is varied.

A method for controlling the exchange bias magnetic field is described next. The control layer 11 that contains mainly an antiferromagnetic material or ferrimagnetic material having the magnetoelectric effect is magnetically connected to the magnetization free layer 12 via exchange coupling. That is, the exchange bias magnetic field is applied, as the effective magnetic field, to the magnetization free layer 12 from the control layer 11. It is known that the exchange bias magnetic field applied to a ferromagnetic material from an antiferromagnetic material reflects the state of the magnetic order of the antiferromagnetic material. The magnetic order of the antiferromagnetic material is very stable against the external magnetic field and is not easily manipulated unless a field heat treatment involving temperature manipulation across the Neel temperature (manipulation typically known as pin annealing in the art) is performed or a very strong magnetic field is applied. However, in the case where an antiferromagnetic material having the magnetoelectric effect is used, this magnetic order of the antiferromagnetic material can be actively manipulated by applying superposition of an electric field and a magnetic field from the outside. Therefore, the control layer 11 is capable of changing the exchange bias magnetic field by magnetoelectric manipulation. As a result, the control layer 11 is capable of controlling the frequency of spin precession in the magnetization free layer 12 by magnetoelectric manipulation.

At that time, the exchange bias magnetic field applied from the control layer 11 does not vary depending on the direction of only one of the applied electric field and the applied magnetic field. Rather, the direction of the exchange bias magnetic field can be varied depending on whether the relationship between the applied electric field and the applied magnetic field is substantially parallel or substantially antiparallel. That is, the exchange bias magnetic field can be varied by switching the direction of the electric field with the direction of the magnetic field fixed, by switching the direction of the magnetic field with the direction of the electric field fixed, or by switching the directions of both the electric field and the magnetic field. In the first embodiment, the electric field and the magnetic field may be applied with some inclination from each other as long as the magnetoelectric effect can be utilized. The strength of the exchange bias magnetic field can be adjusted by varying the product of the electric field and the magnetic field. The control layer 11 is further capable of maintaining the exchange bias magnetic field in the varied state even after the electric field and the magnetic field are removed. As a result, the variable-frequency magnetoresistive effect element 100 according to the first embodiment is capable of greatly reducing energy consumption of a device compared with a scheme in which the electric field and/or the magnetic field are continuously used to vary the frequency.

The magnetic-field applying mechanism 21 is described. An electromagnet using a coil or a permanent magnet can be used for the magnetic-field applying mechanism 21. However, the magnetic-field applying mechanism 21 is not limited to such a mechanism as long as the mechanism is capable of applying a magnetic field to the magnetoresistive effect element 10. In the case where a permanent magnet is used for the magnetic-field applying mechanism 21, the direction of the magnetic field is fixed to one direction and the magnitude of the magnetic field is also fixed. However, the exchange bias magnetic field is successfully manipulated by varying the direction and magnitude of the electric field. In this case, the magnetic field necessary for frequency control can be applied without any energy consumption, resulting in a further reduction in energy necessary for control. As a result, the variable-frequency magnetoresistive effect element 100 that consumes less energy can be provided.

The electric-field applying mechanism 31 is described. The electric-field applying mechanism 31 may be implemented in the following manner. An electrode layer serving as an opposing electrode is disposed on a side of the control layer 11 opposite to the magnetization free layer 12. A voltage is applied across this electrode layer and the magnetization free layer 12. In this way, an electric field is successfully applied in parallel to the stacking direction. Alternatively, two electrode layers may be disposed on the respective sides of the control layer 11. In this way, an electric field is successfully applied perpendicularly to the stacking direction. The electric-field applying mechanism 31 is not limited to such a mechanism as long as the mechanism is capable of substantially applying an electric field to the magnetoresistive effect element 10.

Figure 3:
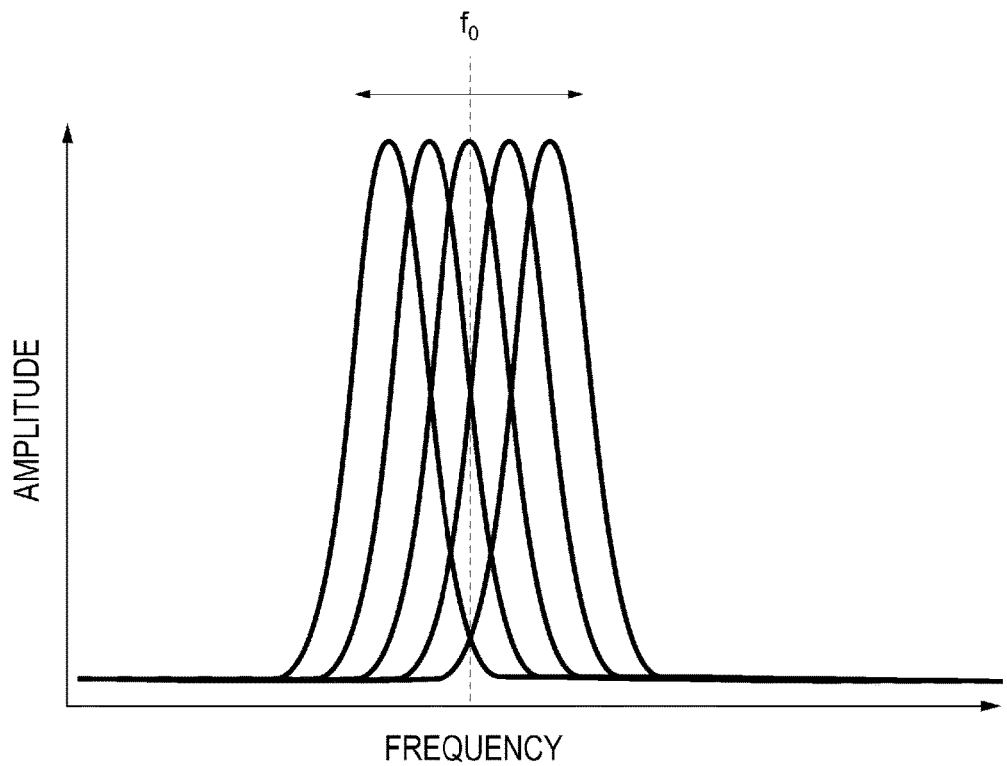
FIG. 3 is a graph illustrating frequency characteristics of spin precession in the magnetoresistive effect element according to the first embodiment.

FIG. 3 is a graph illustrating a relationship between the frequency and the amplitude of spin precession in the magnetization free layer 12 according to the first embodiment. In FIG. 3, the vertical axis represents the amplitude, and the horizontal axis represents the frequency. The resonance frequency $f_0$ is a resonance frequency in the case where the exchange bias magnetic field $H_{EB}$ is 0. The exchange bias magnetic field applied from the control layer 11 can take 0 or a positive or negative finite value. As a result, frequency characteristics of the spin precession in the magnetization free layer 12 can be shifted to the higher-frequency side or the lower-frequency side with respect to the resonant frequency $f_0$ as illustrated in FIG. 3. In other words, the oscillation frequency or the resonance frequency of the magnetoresistive effect element 10 can be shifted to the higher-frequency side or the lower-frequency side. For example, in the case where the exchange bias magnetic field applied to the magnetization free layer 12 from the control layer 11 is positive, the frequency of spin precession in the magnetoresistive effect element 10 shifts to the higher-frequency side if the strength of the exchange bias magnetic field is increased. As a result, the operating frequency of an oscillator, detector, or filter using the magnetoresistive effect element 10 can be adjusted to the higher-frequency side. On the other hand, in the case where the exchange bias magnetic field applied to the magnetization free layer 12 from the control layer 11 is negative, the oscillation frequency or the resonance frequency of the magnetoresistive effect element 10 shifts to the lower-frequency side if the strength of the exchange bias magnetic field is increased. As a result, the operating frequency of an oscillator, detector, or filter using the magnetoresistive effect element 10 can be adjusted to the lower-frequency side.

The most basic configuration according to embodiments of the present invention has been described in the first embodiment above. In particular, the description has been given of the configuration of using the exchange bias magnetic field that is applied from the control layer 11 and is controllable using the magnetoelectric effect, which is a feature of the present invention. In each of second to fourth embodiments below, a description will be given of magnetization arrangement in the magnetization free layer 12 and the magnetization fixed layer 14 for using spin precession and effective application directions of the electric field and the magnetic field.

Second Embodiment

Figure 4:
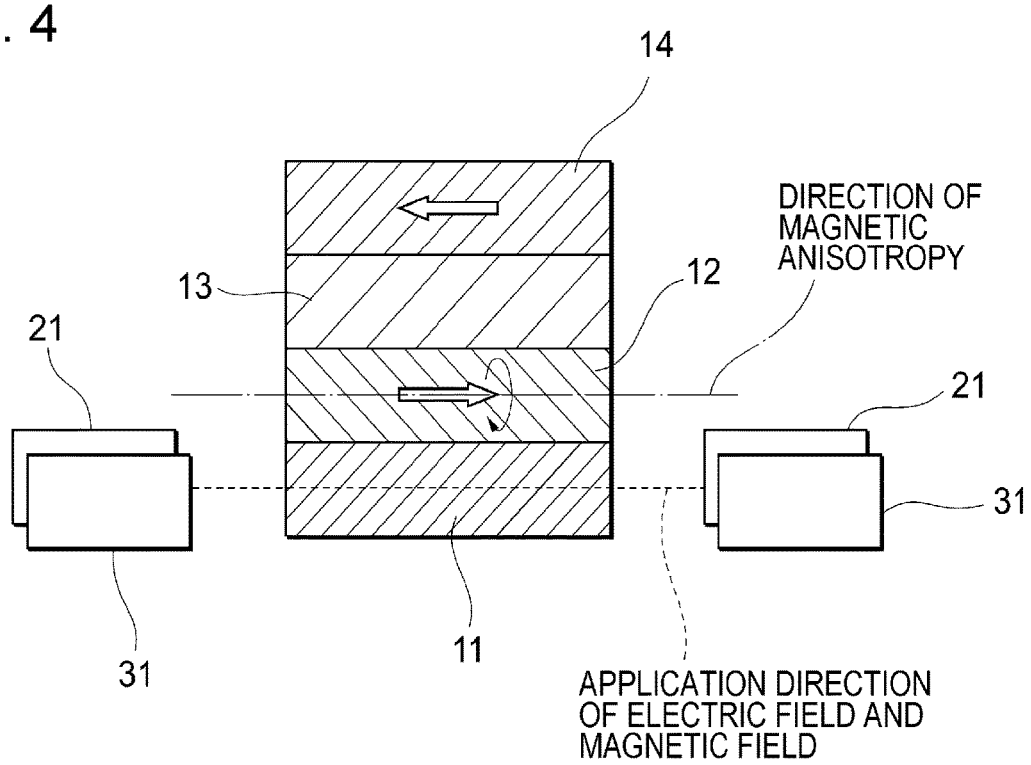
FIG. 4 is a schematic diagram illustrating a relationship between a direction of a magnetic easy axis of a magnetization free layer of a magnetoresistive effect element and an application direction of an electric field and a magnetic field in accordance with a second embodiment.

FIG. 4 is a schematic diagram illustrating a positional relationship among the magnetoresistive effect element 10, the magnetic-field applying mechanism 21, and the electric-field applying mechanism 31 in accordance with a second embodiment of the present invention. The magnetoresistive effect element 10 includes the control layer 11, the magnetization free layer 12 in which the direction of magnetization is variable, the intermediate layer 13, and the magnetization fixed layer 14 in which the direction of magnetization is fixed. The magnetization fixed layer 14 is composed of a ferromagnetic material, and the magnetization direction of the magnetization fixed layer 14 is substantially fixed to one in-plane direction of the magnetization fixed layer 14. The magnetic-field applying mechanism 21 has a function of applying a magnetic field to the control layer 11 in a direction perpendicular to the stacking direction. The electric-field applying mechanism 31 has a function of applying an electric field to the control layer 11 in a direction perpendicular to the stacking direction. In FIG. 4, a dash line represents the application direction of the magnetic field and the electric field respectively applied by the magnetic-field applying mechanism 21 and the electric-field applying mechanism 31, and a dot-dash line represents the direction of the magnetic anisotropy in the magnetization free layer 12. The magnetic-field applying mechanism 21 and the electric-field applying mechanism 31 may be arranged in contact with the control layer 11 or spaced apart from the control layer 11 as long as the magnetic-field applying mechanism 21 and the electric-field applying mechanism 31 substantially have the functions of applying a magnetic field and an electric field to the control layer 11, respectively.

The magnetization free layer 12 according to the second embodiment has uniaxial magnetic anisotropy in the in-plane direction, and the magnetization direction of the magnetization free layer 12 is in the in-plane direction thereof. Arrows illustrated in FIG. 4 represent the magnetization direction of the magnetization free layer 12 and the magnetization direction of the magnetization fixed layer 14. A flow of spin-polarized current can cause spin precession in the magnetization free layer 12, and consequently the spin torque oscillation effect and the spin torque resonance effect can be obtained. Magnetization of the magnetization free layer 12 is in the direction of the effective magnetic field in the magnetization free layer 12 before the current is applied to the magnetoresistive effect element 10. As represented by Equation 4, the effective magnetic field is the sum of the external magnetic field, the anisotropic magnetic field, the demagnetizing field, and the exchange bias magnetic field in the magnetization free layer 12. In FIG. 4, the magnetization direction of the magnetization free layer 12 and the magnetization direction of the magnetization fixed layer 14 are opposite to each other. However, these magnetization directions are not limited to the illustrated directions as long as the magnetization directions are different from each other.

The control layer 11 according to the second embodiment has a function of causing an exchange bias magnetic field in an in-plane direction for the magnetization free layer 12. The control layer 11 further has a function of varying the exchange bias magnetic field in response to ME manipulation in which an electric field and a magnetic field perpendicular to the stacking direction are used and of maintaining the resulting state. With such functions, the magnetoresistive effect element 10 is capable of varying the spin torque oscillation frequency and the spin torque resonance frequency by ME manipulation.

In the case where a DC having a current density of an oscillation threshold current density or higher flows through the magnetoresistive effect element 10 according to the second embodiment, magnetization in the magnetization free layer 12 oscillates mainly with respect to the in-plane direction owing to spin torque and an AC signal corresponding to the oscillation frequency of the magnetization can be extracted owing to the magnetoresistive effect. That is, so-called spin torque oscillation effect occurs in the magnetoresistive effect element 10. In addition, in the case where an AC signal having a frequency equal to the resonance frequency flows through the magnetoresistive effect element 10, the magnetization in the magnetization free layer 12 oscillates mainly with respect to the in-plane direction owing to spin torque and the AC signal can be converted into a DC signal in accordance with the oscillation frequency of the magnetization and the DC signal can be extracted or impedance can be reduced for a frequency component corresponding to the oscillation frequency of the magnetization. That is, so-called spin torque resonance effect occurs in the magnetoresistive effect element 10. In general, the oscillation frequency of the magnetization in the magnetization free layer in the case of oscillation of the magnetization caused by such spin torque is in a high-frequency band of several to several tens of gigahertz (GHz).

Third Embodiment

Figure 5:
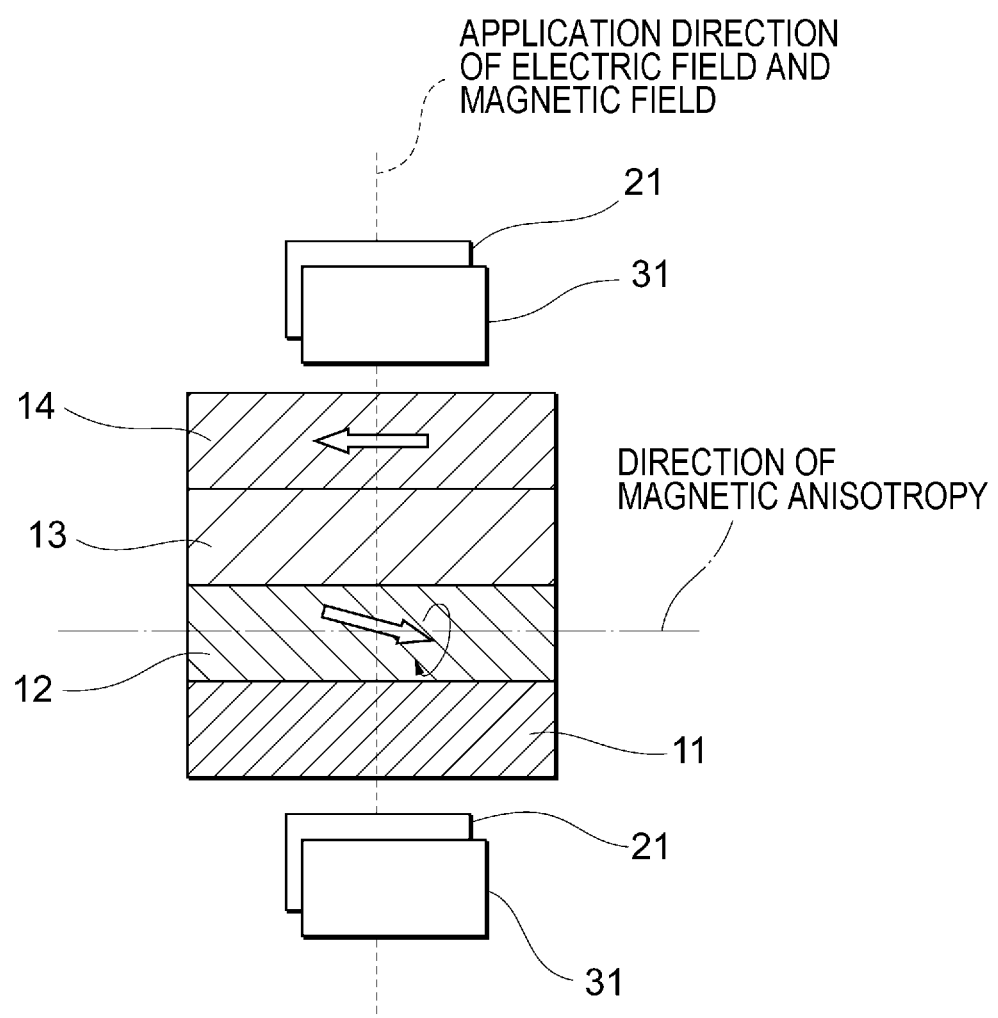
FIG. 5 is a schematic diagram illustrating a relationship between a direction of a magnetic easy axis of a magnetization free layer of a magnetoresistive effect element and an application direction of an electric field and a magnetic field in accordance with a third embodiment.

FIG. 5 is a schematic diagram illustrating a positional relationship among the magnetoresistive effect element 10, the magnetic-field applying mechanism 21, and the electric-field applying mechanism 31 in accordance with a third embodiment of the present invention. The magnetoresistive effect element 10 includes the control layer 11, the magnetization free layer 12 in which the direction of magnetization is variable, the intermediate layer 13, and the magnetization fixed layer 14 in which the direction of magnetization is fixed. The magnetization fixed layer 14 is composed of a ferromagnetic material, and the magnetization direction of the magnetization fixed layer 14 is substantially fixed to one in-plane direction of the magnetization fixed layer 14. The magnetic-field applying mechanism 21 has a function of applying a magnetic field to the control layer 11 in a direction perpendicular to an in-plane direction of the control layer 11. The electric-field applying mechanism 31 has a function of applying an electric field to the control layer 11 in a direction perpendicular to an in-plane direction of the control layer 11. In FIG. 5, a dash line represents the application direction of the magnetic field and the electric field respectively applied by the magnetic-field applying mechanism 21 and the electric-field applying mechanism 31, and a dot-dash line represents the direction of the magnetic anisotropy in the magnetization free layer 12. The magnetic-field applying mechanism 21 and the electric-field applying mechanism 31 may be arranged in contact with the control layer 11 or spaced apart from the control layer 11 as long as the magnetic-field applying mechanism 21 and the electric-field applying mechanism 31 substantially have the functions of applying a magnetic field and an electric field to the control layer 11, respectively.

The magnetization free layer 12 according to the third embodiment has uniaxial magnetic anisotropy in the in-plane direction. Arrows illustrated in FIG. 5 represent the magnetization direction of the magnetization free layer 12 and the magnetization direction of the magnetization fixed layer 14. A flow of spin-polarized current can cause spin precession in the magnetization free layer 12, and consequently the spin torque oscillation effect and the spin torque resonance effect can be obtained. Magnetization of the magnetization free layer 12 is in the direction of the effective magnetic field in the magnetization free layer 12 before the current is applied to the magnetoresistive effect element 10. The effective magnetic field is the sum of the external magnetic field, the anisotropic magnetic field, the demagnetizing field, and the exchange bias magnetic field in the magnetization free layer 12. In FIG. 5, the magnetization direction of the magnetization free layer 12 and the magnetization direction of the magnetization fixed layer 14 are illustrated by way of example. The magnetization directions of the magnetization free layer 12 and the magnetization fixed layer 14 are not limited to the illustrated directions as long as the magnetization directions are different from each other.

The control layer 11 according to the third embodiment has a function of causing an exchange bias magnetic field in a direction perpendicular to an in-plane direction for the magnetization free layer 12. The control layer 11 further has a function of varying the exchange bias magnetic field in accordance with superposition of the electric field and the magnetic field in a stack in-plane direction by using the ME effect and of maintaining the state.

In the case where a DC having a current density of an oscillation threshold current density or higher flows through the magnetoresistive effect element 10 according to the third embodiment, magnetization in the magnetization free layer 12 oscillates mainly with respect to the in-plane direction owing to spin torque and an AC signal corresponding to the oscillation frequency of the magnetization can be extracted owing to the magnetoresistive effect. That is, so-called spin torque oscillation effect occurs in the magnetoresistive effect element 10. In addition, in the case where an AC signal having a frequency equal to the resonance frequency flows through the magnetoresistive effect element 10, the magnetization in the magnetization free layer 12 oscillates mainly with respect to the in-plane direction owing to spin torque and the AC signal can be converted into a DC signal in accordance with the oscillation frequency of the magnetization and the DC signal can be extracted or impedance can be reduced for a frequency component corresponding to the oscillation frequency of the magnetization. That is, so-called spin torque resonance effect occurs in the magnetoresistive effect element 10. In general, the oscillation frequency of the magnetization in the magnetization free layer in the case of oscillation of the magnetization caused by such spin torque is in a high-frequency band of several to several tens of gigahertz (GHz).

Fourth Embodiment

Figure 6:
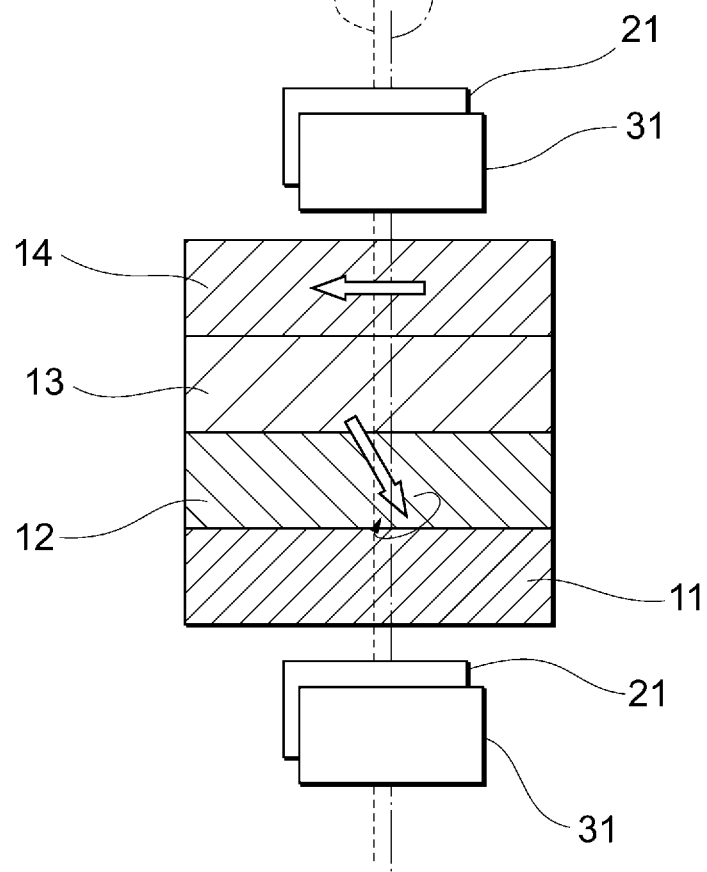
FIG. 6 is a schematic diagram illustrating a relationship between a direction of a magnetic easy axis of a magnetization free layer of a magnetoresistive effect element and an application direction of an electric field and a magnetic field in accordance with a fourth embodiment.

FIG. 6 is a schematic diagram illustrating a positional relationship among the magnetoresistive effect element 10, the magnetic-field applying mechanism 21, and the electric-field applying mechanism 31 in accordance with a fourth embodiment of the present invention. The magnetoresistive effect element 10 includes the control layer 11, the magnetization free layer 12 in which the direction of magnetization is variable, the intermediate layer 13, and the magnetization fixed layer 14 in which the direction of magnetization is fixed. The magnetization fixed layer 14 is composed of a ferromagnetic material, and the magnetization direction of the magnetization fixed layer 14 is substantially fixed to one in-plane direction thereof. The magnetic-field applying mechanism 21 has a function of applying a magnetic field to the control layer 11 in a direction perpendicular to an in-plane direction of the control layer 11. The electric-field applying mechanism 31 has a function of applying an electric field to the control layer 11 in a direction perpendicular to an in-plane direction of the control layer 11. In FIG. 6, a dash line represents the application direction of the magnetic field and the electric field respectively applied by the magnetic-field applying mechanism 21 and the electric-field applying mechanism 31, and a dot-dash line represents the direction of the magnetic anisotropy in the magnetization free layer 12. The magnetic-field applying mechanism 21 and the electric-field applying mechanism 31 may be arranged in contact with the control layer 11 or spaced apart from the control layer 11 as long as the magnetic-field applying mechanism 21 and the electric-field applying mechanism 31 substantially have the functions of applying a magnetic field and an electric field to the control layer 11, respectively.

The magnetization free layer 12 according to the fourth embodiment has uniaxial magnetic anisotropy in the stacking direction, and the magnetization direction of the magnetization free layer 12 is in the stacking direction of the magnetization free layer 12. Arrows illustrated in FIG. 6 represent the magnetization direction of the magnetization free layer 12 and the magnetization direction of the magnetization fixed layer 14. A flow of spin-polarized current can cause spin precession in the magnetization free layer 12, and consequently the spin torque oscillation effect and the spin torque resonance effect can be obtained. Magnetization of the magnetization free layer 12 is in the direction of the effective magnetic field in the magnetization free layer 12 before the current is applied to the magnetoresistive effect element 10. The effective magnetic field is the sum of the external magnetic field, the anisotropic magnetic field, the demagnetizing field, and the exchange bias magnetic field in the magnetization free layer 12. In FIG. 6, the magnetization direction of the magnetization free layer 12 and the magnetization direction of the magnetization fixed layer 14 are illustrated by way of example. The magnetization directions of the magnetization free layer 12 and the magnetization fixed layer 14 are not limited to the illustrated directions as long as the magnetization directions are different from each other.

The control layer 11 according to the fourth embodiment has a function of causing an exchange bias magnetic field in a direction perpendicular to an in-plane direction for the magnetization free layer 12. The control layer 11 further has a function of varying the exchange bias magnetic field in accordance with superposition of an electric field and a magnetic field in the direction perpendicular to the in-plane direction by using the ME effect and of maintaining the state.

In the case where a DC having a current density of an oscillation threshold current density or higher flows through the magnetoresistive effect element 10 according to the fourth embodiment, the magnetization in the magnetization free layer 12 oscillates mainly with respect to the direction perpendicular to the in-plane direction owing to spin torque and an AC signal corresponding to the oscillation frequency of the magnetization can be extracted owing to the magnetoresistive effect. That is, so-called spin torque oscillation effect occurs in the magnetoresistive effect element 10. In addition, in the case where an AC signal having a frequency equal to the resonance frequency flows through the magnetoresistive effect element 10, the magnetization in the magnetization free layer 12 oscillates mainly with respect to the direction perpendicular to the in-plane direction owing to spin torque and the AC signal can be converted into a DC signal in accordance with the oscillation frequency of the magnetization and the DC signal can be extracted or impedance can be reduced for a frequency component corresponding to the oscillation frequency of the magnetization. That is, so-called spin torque resonance effect occurs in the magnetoresistive effect element 10. In general, it is known that the oscillation frequency of the magnetization in the magnetization free layer in the case of oscillation of the magnetization caused by such spin torque is in a high-frequency band of several to several tens of gigahertz (GHz) and the oscillation occurs in a higher frequency band than oscillation in the direction perpendicular to the in-plane direction.

In the first to four embodiments, the description has been given of an example in which the magnetoresistive effect element 10 includes the magnetization free layer 12, the magnetization fixed layer 14, and the intermediate layer 13 disposed between the magnetization free layer 12 and the magnetization fixed layer 14. The magnetoresistive effect element 10 may be replaced with a magnetoresistive effect element including two magnetization free layers and an intermediate layer disposed between these two magnetization free layers. An example of such a magnetoresistive effect element may be a magnetoresistive effect element in which two magnetization free layers are magnetically coupled via an intermediate layer. More specifically, the two magnetization free layers are magnetically coupled via the intermediate layer such that magnetization directions of the two magnetization free layers are antiparallel to each other. In such a magnetoresistive effect element, one of the two magnetization free layers just needs to be magnetically connected to the control layer. Alternatively, for each of the two magnetization free layers, a control layer magnetically connected to the magnetization free layer may be provided.

Embodiments of specific elements will be described below as preferable embodiments of the present invention. An example of a variable-frequency oscillator is described in a fifth embodiment. An example of a variable-frequency detector is described in a sixth embodiment. Examples of a variable-frequency filter are described in seventh and eighth embodiments.

Fifth Embodiment

Figure 7:
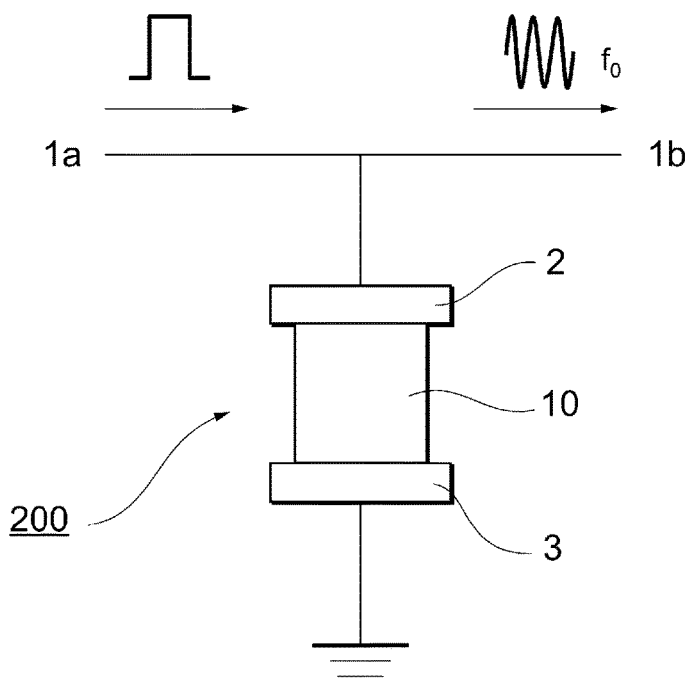
FIG. 7 is a schematic diagram illustrating a configuration of a variable-frequency oscillator according to a fifth embodiment.

FIG. 7 is a schematic diagram of a variable-frequency oscillator 200 according to a fifth embodiment. The variable-frequency oscillator 200 includes the input signal line 1a, an upper electrode 2, the variable-frequency magnetoresistive effect element 100, a lower electrode 3, and the output signal line 1b. Note that FIG. 7 illustrates only the magnetoresistive effect element 10 of the variable-frequency magnetoresistive effect element 100 and omits illustration of the other components of the variable-frequency magnetoresistive effect element 100.

In the fifth embodiment, the input signal line 1a is electrically connected to the upper electrode 2 and has a function of supplying a DC to the magnetoresistive effect element 10. The output signal line 1b is electrically connected to the upper electrode 2 and has a function of extracting an AC signal having a frequency $f_0$ generated in the magnetoresistive effect element 10.

In the fifth embodiment, the upper electrode 2 and the lower electrode 3 function as a pair of electrodes and are arranged in the stacking direction of the magnetoresistive effect element 10 with the magnetoresistive effect element 10 interposed therebetween. That is, the upper electrode 2 and the lower electrode 3 have a function of a pair of electrodes that allows current to flow through the magnetoresistive effect element 10 in a direction crossing the planes of the layers constituting the magnetoresistive effect element 10, for example, in a direction perpendicular to the planes of the layers constituting the magnetoresistive effect element 10 (stacking direction). The lower electrode 3 is connected to the ground.

In the fifth embodiment, the upper electrode 2 and the lower electrode 3 are preferably composed of a material having a high conductivity, such as Cu, Au, or AuCu. In addition, shapes of the upper electrode 2 and the lower electrode 3 in plan view are preferably defined as a microstripline shape or a coplanar waveguide shape. With such a configuration, transmission loss of the AC signal can be reduced.

When a DC is input to the magnetoresistive effect element 10 of the variable-frequency magnetoresistive effect element 100 according to the fifth embodiment, an AC signal having a frequency equal to the frequency of spin precession is generated owing to the spin torque oscillation effect.

Figure 8:
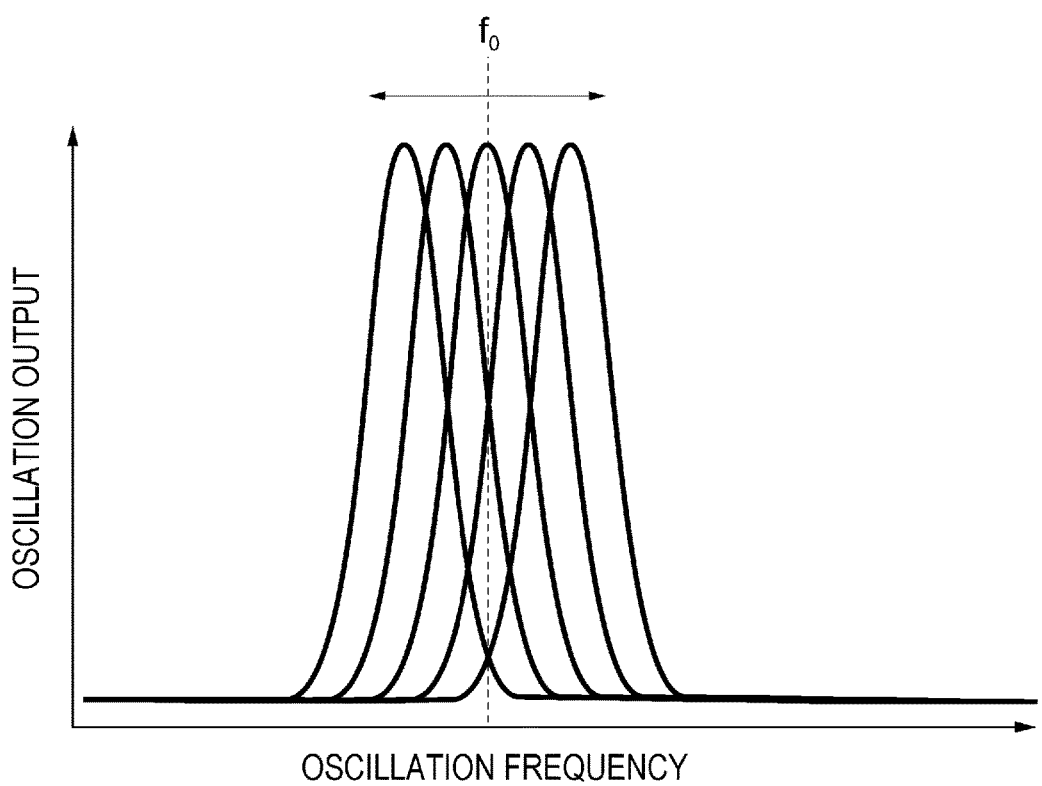
FIG. 8 is a graph illustrating how oscillation frequency of the variable-frequency oscillator according to the fifth embodiment varies.

FIG. 8 is a graph illustrating frequency characteristics of the spin torque oscillation effect caused in the magnetoresistive effect element 10 according to the fifth embodiment. The horizontal axis represents the frequency of the output AC signal, and the vertical axis represents the oscillation output. As illustrated in FIG. 8, a large oscillation output can be obtained at a frequency that is equal to or substantially equal to the spin torque oscillation frequency $f_0$ of the magnetoresistive effect element 10. At that time, the oscillation output increases in proportion to the magnetoresistance ratio (MR) of the magnetoresistive effect element 10.

Further, the variable-frequency oscillator 200 is capable of shifting the spin torque oscillation effect to the higher frequency side or the lower frequency side by varying the exchange bias magnetic field applied to the magnetization free layer 12 from the control layer 11. That is, the variable-frequency oscillator 200 is capable of controlling the frequency characteristics of the spin torque oscillation effect obtained from the magnetoresistive effect element 10 to be tunable by applying the exchange bias magnetic field to the magnetization free layer 12 from the control layer 11 so that the spin torque oscillation frequency $f_0$ of the magnetization in the magnetization free layer 12 becomes a desired oscillation frequency.

For example, in the case where it is desired to shift the frequency of the output AC signal to be higher, the exchange bias magnetic field applied to the magnetization free layer 12 from the control layer 11 in the fifth embodiment is varied so that the effective magnetic field $H_{eff}$ strengthens. In this way, the spin torque oscillation frequency $f_0$ in the magnetization free layer 12 is successfully set to be higher. As a result, the frequency of the oscillated AC signal can be set higher. In the case where it is desired to shift the frequency of the output AC signal to be lower, the exchange bias magnetic field applied to the magnetization free layer 12 from the control layer 11 is varied so that the effective magnetic field $H_{eff}$ weakens. In this way, the spin torque oscillation frequency $f_0$ in the magnetization free layer 12 is successfully set to be lower. As a result, the frequency of the oscillated AC signal can be set lower. With such a configuration, a variable-frequency oscillator capable of achieving the largest oscillation output at the set frequency can be obtained.

The exchange bias magnetic field applied to the magnetization free layer 12 from the control layer 11 in the fifth embodiment can be set by simultaneously applying a predetermined magnetic field and a predetermined electric field to the control layer 11 respectively from the magnetic-field applying mechanism 21 and the electric-field applying mechanism 31. Further, the state of the exchange bias magnetic field that has been set can be maintained even after the applied magnetic field and electric field are removed. Thus, the resulting spin torque oscillation frequency can be maintained even after the magnetic field and the electric field are removed. Further, even if the oscillation frequency alters due to an influence of disturbance or the like after being set, re-adjusting the magnitude of the exchange bias magnetic field enables oscillation at the predetermined frequency again. Thus, a state of a large oscillation output can be easily maintained even if there is an influence of disturbance or the like.

Sixth Embodiment

Figure 9:
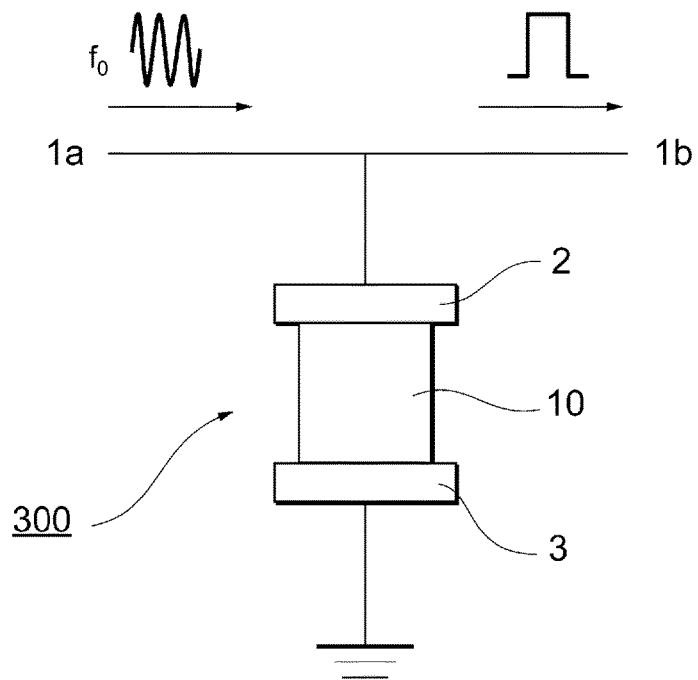
FIG. 9 is a schematic diagram illustrating a configuration of a variable-frequency detector according to a sixth embodiment.

FIG. 9 is a schematic diagram of a variable-frequency detector 300 according to a sixth embodiment. The variable-frequency detector 300 includes the input signal line 1a, the upper electrode 2, the variable-frequency magnetoresistive effect element 100, the lower electrode 3, and the output signal line 1b. Note that FIG. 9 illustrates only the magnetoresistive effect element 10 of the variable-frequency magnetoresistive effect element 100 and omits illustration of the other components of the variable-frequency magnetoresistive effect element 100.

In the sixth embodiment, the input signal line 1a is electrically connected to the upper electrode 2 and has a function of supplying an AC signal including a component of the frequency $f_0$ to the magnetoresistive effect element 10.

The output signal line 1b is electrically connected to the upper electrode 2 and has a function of extracting an output voltage corresponding to the frequency $f_0$ and generated in the magnetoresistive effect element 10.

In the sixth embodiment, the upper electrode 2 and the lower electrode 3 function as a pair of electrodes and are arranged in the staking direction of the magnetoresistive effect element 10 with the magnetoresistive effect element 10 interposed therebetween. That is, the upper electrode 2 and the lower electrode 3 have a function of a pair of electrodes that allows current to flow through the magnetoresistive effect element 10 in a direction crossing the planes of the layers constituting the magnetoresistive effect element 10, for example, in a direction perpendicular to the planes of the layers constituting the magnetoresistive effect element 10 (stacking direction). The lower electrode 3 is connected to the ground.

In the sixth embodiment, the upper electrode 2 and the lower electrode 3 are preferably composed of a material having a high conductivity, such as Cu, Au, or AuCu. In addition, shapes of the upper electrode 2 and the lower electrode 3 in plan view are preferably defined as a microstripline shape or a coplanar waveguide shape. With such a configuration, transmission loss of the AC signal can be reduced.

When an AC signal having a frequency close to the spin torque resonance frequency $f_0$ is input to the magnetoresistive effect element 10 of the variable-frequency magnetoresistive effect element 100 according to the sixth embodiment, a DC voltage (hereinafter, referred to as an output voltage) that is proportional to the square of the amplitude of the AC signal is generated by the spin torque diode effect.

Figure 10:
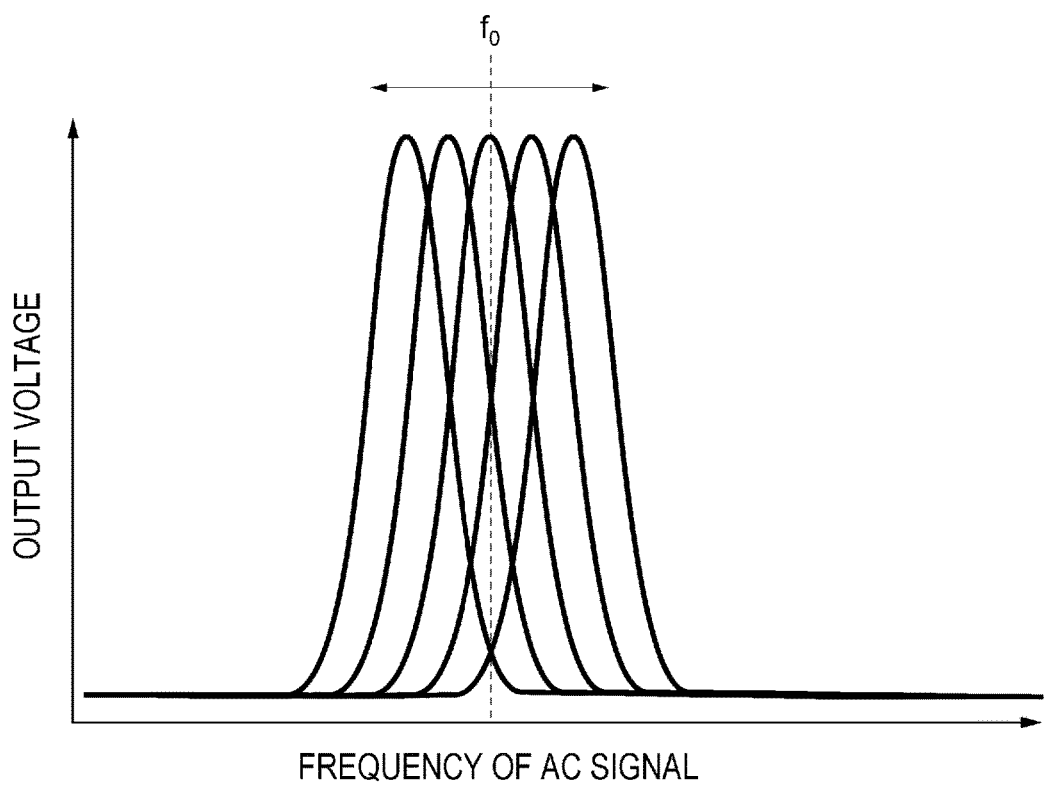
FIG. 10 is a graph illustrating how response frequency of the variable-frequency detector according to the sixth embodiment varies.

FIG. 10 is a graph illustrating frequency characteristics of the spin torque diode effect in the magnetoresistive effect element 10 according to the sixth embodiment. The horizontal axis represents the frequency of the AC signal, and the vertical axis represents the output voltage. As is apparent from FIG. 10, a large output voltage is generated when the frequency component of the AC signal is equal to the spin torque resonance frequency $f_0$ of the magnetoresistive effect element 10. At that time, the output voltage increases in proportion to the magnetoresistance ratio (MR) of the magnetoresistive effect element 10.

Further, the variable-frequency detector 300 is capable of shifting the spin torque resonance effect to the higher-frequency side or the lower-frequency side by varying the exchange bias magnetic field applied to the magnetization free layer 12 from the control layer 11. That is, the variable-frequency detector 300 is capable of controlling the frequency characteristics of the spin torque diode effect obtained from the magnetoresistive effect element 10 to be tunable by applying the exchange bias magnetic field to the magnetization free layer 12 from the control layer so that the spin torque resonance frequency of the magnetization in the magnetization free layer 12 becomes equal to the frequency of the input AC signal.

For example, in the case where the frequency of the input AC signal is lower than the spin torque resonance frequency $f_0$, the spin torque resonance frequency $f_0$ of the magnetization free layer 12 is successfully set to be lower by varying the exchange bias magnetic field applied to the magnetization free layer 12 from the control layer 11 in the sixth embodiment so that the effective magnetic field $H_{eff}$ weakens. As a result, the spin torque resonance frequency $f_0$ of the magnetization free layer 12 can be set equal to the frequency of the input AC signal. On the other hand, in the case where the frequency of the input AC signal is higher than the spin torque resonance frequency $f_0$, the spin torque resonance frequency $f_0$ in the magnetization free layer 12 can be set to be higher by varying the exchange bias magnetic field applied to the magnetization free layer 12 from the control layer 11 so that the effective magnetic field $H_{eff}$ strengthens. As a result, the spin torque resonance frequency $f_0$ of the magnetization free layer 12 can be set equal to the frequency of the input AC signal. In this way, the output voltage corresponding to the frequency of the input AC signal can be maximized. That is, a variable-frequency detector capable of obtaining a largest output signal even if the frequency of the input AC signal varies can be obtained.

The exchange bias magnetic field applied to the magnetization free layer 12 from the control layer 11 in the sixth embodiment can be set by simultaneously applying a predetermined magnetic field and a predetermined electric field to the control layer 11 respectively from the magnetic-field applying mechanism 21 and the electric-field applying mechanism 31. Further, the state of the exchange bias magnetic field that has been set can be maintained even after the applied magnetic field and electric field are removed. Thus, the resulting spin torque resonance frequency $f_0$ can be maintained even after the magnetic field and the electric field are removed. Further, even if the spin torque resonance frequency $f_0$ deviates from the frequency of the input AC signal due to an influence of disturbance or the like after being set equal to the frequency of the input AC signal, the spin torque resonance frequency $f_0$ can be set equal to the frequency of the input AC signal again by re-adjusting the magnitude of the exchange bias magnetic field. Thus, a state of a large output signal can be easily maintained even if there is an influence of disturbance or the like.

Seventh Embodiment

Figure 11:
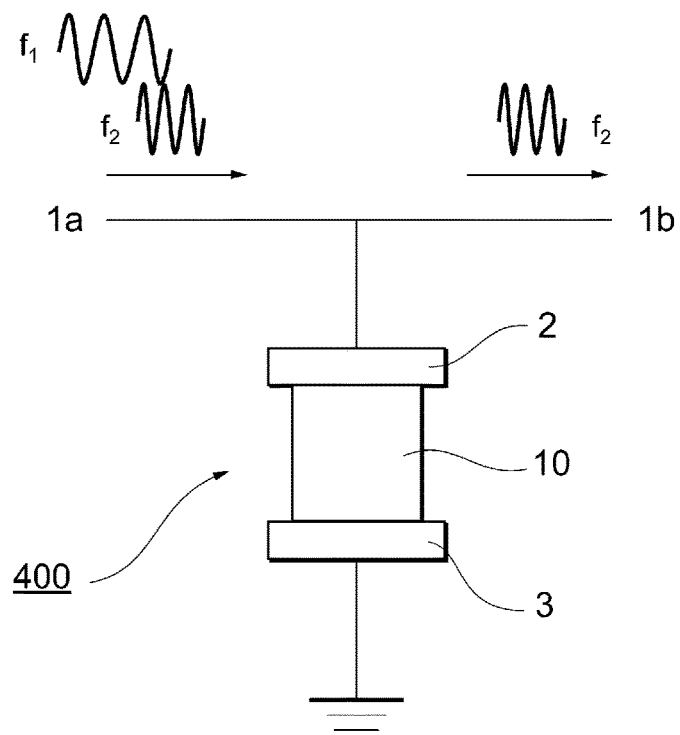
FIG. 11 is a schematic diagram illustrating a configuration of a variable-frequency filter according to a seventh embodiment.

FIG. 11 is a schematic diagram of a variable-frequency filter 400 according to a seventh embodiment. The variable-frequency filter 400 includes the input signal line 1a, the upper electrode 2, the variable-frequency magnetoresistive effect element 100, the lower electrode 3, and the output signal line 1b. Note that FIG. 11 illustrates only the magnetoresistive effect element 10 of the variable-frequency magnetoresistive effect element 100 and omits illustration of the other components of the variable-frequency magnetoresistive effect element 100.

In the seventh embodiment, the input signal line 1a is electrically connected to the upper electrode 2 and has a function of supplying an AC signal including at least a component of a first frequency and a component of a second frequency different from the first frequency to the magnetoresistive effect element 10. Hereinafter, the first frequency and the second frequency are respectively denoted by $f_1$ and $f_2$. The output signal line 1b is electrically connected to the upper electrode 2 and has a function of extracting an AC signal output from the magnetoresistive effect element 10.

In the seventh embodiment, the upper electrode 2 and the lower electrode 3 function as a pair of electrodes and are arranged in the stacking direction of the magnetoresistive effect element 10 with the magnetoresistive effect element 10 interposed therebetween. That is, the upper electrode 2 and the lower electrode 3 have a function of a pair of electrodes that allows current to flow through the magnetoresistive effect element 10 in a direction crossing the planes of the layers constituting the magnetoresistive effect element 10, for example, in a direction perpendicular to the planes of the layers constituting the magnetoresistive effect element 10 (stacking direction). The lower electrode 3 is connected to the ground.

In the seventh embodiment, the upper electrode 2 and the lower electrode 3 are preferably composed of a material having a high conductivity, such as Cu, Au, or AuCu. In addition, shapes of the upper electrode 2 and the lower electrode 3 in plan view are preferably defined as a microstripline shape or a coplanar waveguide shape. With such a configuration, transmission loss of the AC signal can be reduced.

When an AC signal including a frequency close to the spin torque resonance frequency $f_0$ is input to the magnetoresistive effect element 10 of the variable-frequency filter 400 according to the seventh embodiment, the spin torque resonance effect can be caused in the magnetoresistive effect element 10. At that time, the magnetoresistive effect element 10 can be handled as an element whose resistance periodically varies at a frequency corresponding to the spin torque resonant frequency $f_0$. Owing to this effect, element impedance of the magnetoresistive effect element 10 reduces at a frequency equal to the spin torque resonance frequency $f_0$. Connection of the magnetoresistive effect element 10 in parallel to the input signal line 1a and the output signal line 1b allows an AC signal having a frequency close to the spin torque resonance frequency $f_0$ of the magnetoresistive effect element 10 of the AC signal input from the input signal line 1a to easily flow into the magnetoresistive effect element 10 and hinders the AC signal having such a frequency from flowing into the output signal line 1b. That is, the AC signal input from the input signal line 1a can be hindered from flowing into the output signal line 1b at a frequency near the spin torque resonance frequency $f_0$ of the magnetoresistive effect element 10.

Figure 12:
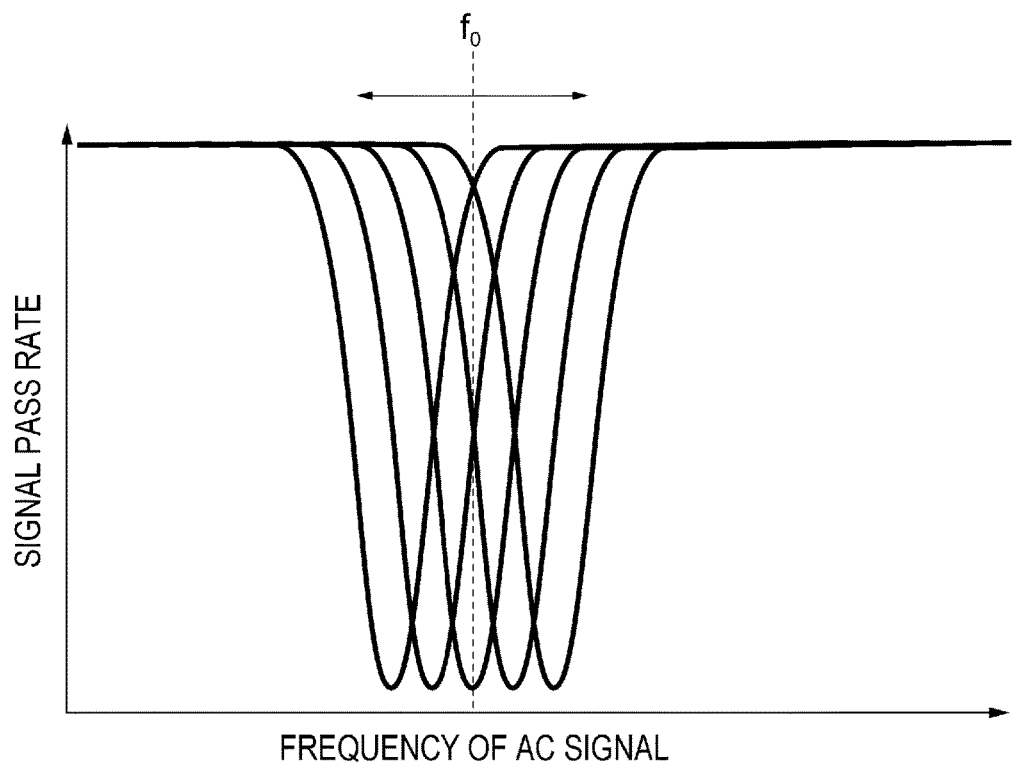
FIG. 12 is a graph illustrating the frequency dependence of signal pass characteristics of the variable-frequency filter according to the seventh embodiment.

FIG. 12 is a graph illustrating frequency characteristics of the variable-frequency filter 400 according to the seventh embodiment. The horizontal axis represents the frequency of the AC signal, and the vertical axis represents the signal pass rate. As is apparent from FIG. 12, the signal pass rate greatly reduces at frequencies where the frequency component of the AC signal is equal to the spin torque resonance frequency $f_0$ of the magnetoresistive effect element 10. That is, the variable-frequency filter 400 can have a function of attenuating an AC signal, in the input AC signal, having a frequency component equal to the resonance frequency $f_0$ of spin precession in the magnetoresistive effect element 10, that is, a function of so-called band elimination filter.

Further, the variable-frequency filter 400 according to the seventh embodiment is capable of shifting the spin torque resonance effect to the higher frequency side or the lower frequency side by varying the exchange bias magnetic field applied to the magnetization free layer 12 from the control layer 11. That is, the variable-frequency filter 400 is capable of controlling the frequency characteristics of the variable-frequency filter 400 to be tunable by applying the exchange bias magnetic field to the magnetization free layer 12 from the control layer 11 so that the spin torque resonance frequency $f_0$ of magnetization in the magnetization free layer 12 becomes equal to a desired cutoff frequency.

For example, in the case where the frequency of the AC signal to be cut off by the variable-frequency filter 400 is desired to be shifted to be higher, the spin torque resonance frequency $f_0$ of the magnetization free layer 12 is successfully set to be higher by varying the exchange bias magnetic field applied to the magnetization free layer 12 from the control layer 11 in the seventh embodiment so that the effective magnetic field $H_{eff}$ strengthens. As a result, the frequency of the AC signal to be cut off can be set to be higher. On the other hand, in the case where the frequency of the AC signal to be cut off by the variable-frequency filter 400 is desired to be shifted to be lower, the spin torque resonance frequency $f_0$ of the magnetization free layer 12 is successfully set to be lower by varying the exchange bias magnetic field applied to the magnetization free layer 12 from the control layer 11 so that the effective magnetic field $H_{eff}$ weakens. As a result, the frequency of the AC signal to be cut off can be set to be lower. In this way, a variable-frequency filter capable of having the best cutoff characteristics at a set frequency can be obtained. For example, in the case where an AC signal including a first frequency component and a second frequency component is input to the magnetoresistive effect element 10, the variable-frequency filter 400 is able to output a signal obtained by attenuating the signal of the first frequency component (AC signal mainly of the second frequency component in this example) as illustrated in FIG. 11 by setting the spin torque resonance frequency $f_0$ in the magnetization free layer 12 to be equal to the first frequency $f_1$. In this case, a DC voltage is generated in the variable-frequency filter 400 as in the variable-frequency detector 300 illustrated in FIG. 9. If this DC voltage is desired to be eliminated, a capacitor may be connected in series to the output signal line 1b.

The exchange bias magnetic field applied to the magnetization free layer 12 from the control layer 11 can be set by simultaneously applying a predetermined magnetic field and a predetermined electric field to the control layer 11 respectively from the magnetic-field applying mechanism 21 and the electric-field applying mechanism 31. Further, the state of the exchange bias magnetic field that has been set can be maintained even after the applied magnetic field and electric field are removed. Thus, the resulting spin torque resonance frequency $f_0$ can be maintained even after the magnetic field and the electric field are removed. Further, even if the cutoff frequency shifts due to an influence of disturbance or the like after being set, the signal of the predetermined frequency can be cut off again by re-adjusting the magnitude of the exchange bias magnetic field. Thus, a state of good cutoff characteristics can be easily maintained even if there is an influence of disturbance or the like.

Eighth Embodiment

Figure 13:
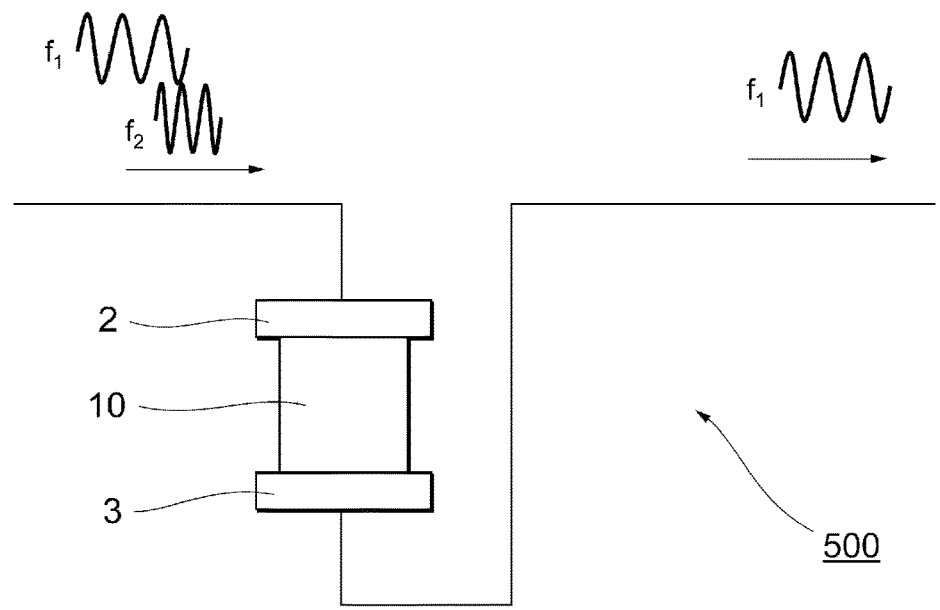
FIG. 13 is a schematic diagram illustrating a configuration of a variable-frequency filter according to an eighth embodiment.

FIG. 13 is a schematic diagram of a variable-frequency filter 500 according to an eighth embodiment. The variable-frequency filter 500 includes the input signal line 1a, the upper electrode 2, the variable-frequency magnetoresistive effect element 100, the lower electrode 3, and the output signal line 1b. Note that FIG. 13 illustrates only the magnetoresistive effect element 10 of the variable-frequency magnetoresistive effect element 100 and omits illustration of the other components of the variable-frequency magnetoresistive effect element 100.

In the eighth embodiment, the input signal line 1a is electrically connected to the upper electrode 2 and has a function of supplying an AC signal including at least a component of a first frequency and a component of a second frequency different from the first frequency to the magnetoresistive effect element 10. Hereinafter, the first frequency and the second frequency are respectively denoted by $f_1$ and $f_2$. The output signal line 1b is electrically connected to the lower electrode 3 and has a function of extracting an AC signal output from the magnetoresistive effect element 10.

In the eighth embodiment, the upper electrode 2 and the lower electrode 3 function as a pair of electrodes and are arranged in the stacking direction of the magnetoresistive effect element 10 with the magnetoresistive effect element 10 interposed therebetween. That is, the upper electrode 2 and the lower electrode 3 have a function of a pair of electrodes that allows current to flow through the magnetoresistive effect element 10 in a direction crossing the planes of the layers constituting the magnetoresistive effect element 10, for example, in a direction perpendicular to the planes of the layers constituting the magnetoresistive effect element 10 (stacking direction).

In the eighth embodiment, the upper electrode 2 and the lower electrode 3 are preferably composed of a material having a high conductivity, such as Cu, Au, or AuCu. In addition, shapes of the upper electrode 2 and the lower electrode 3 in plan view are preferably defined as a microstripline shape or a coplanar waveguide shape. With such a configuration, transmission loss of the AC signal can be reduced.

When an AC signal including a frequency close to the spin torque resonance frequency $f_0$ is input to the magnetoresistive effect element 10 of the variable-frequency filter 500 according to the eighth embodiment, the spin torque resonance effect can be caused in the magnetoresistive effect element 10. At that time, the magnetoresistive effect element 10 can be handled as an element whose resistance periodically varies at a frequency corresponding to the spin torque resonant frequency $f_0$. Owing to this effect, element impedance of the magnetoresistive effect element 10 reduces at a frequency equal to the spin torque resonance frequency $f_0$. Connection of the magnetoresistive effect element 10 in series to the input signal line 1a and the output signal line 1b allows an AC signal, in the AC signal input from the input signal line 1a, having a frequency close to the spin torque resonance frequency $f_0$ of the magnetoresistive effect element 10 to easily pass through the magnetoresistive effect element 10 and easily flow into the output signal line 1b. That is, the AC signal input from the input signal line 1a can be attenuated at non-resonance frequencies at which impedance is high and can pass through at the resonance frequency at which impedance is low.

Figure 14:
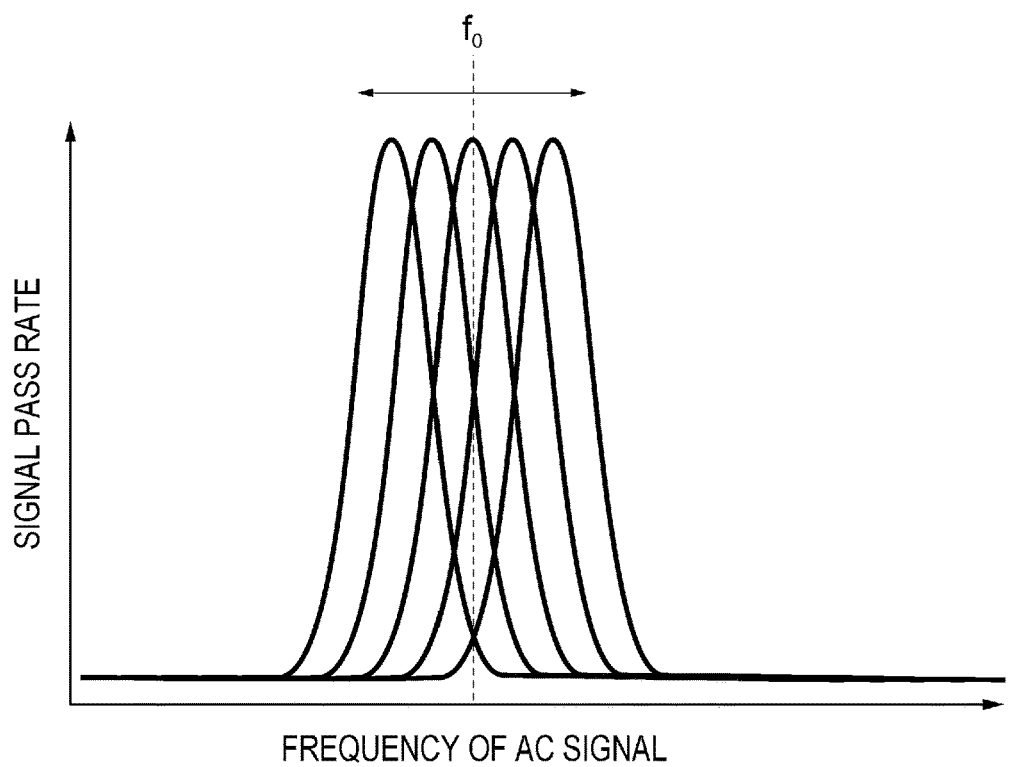
FIG. 14 is a graph illustrating the frequency dependence of signal pass characteristics of the variable-frequency filter according to the eighth embodiment.

FIG. 14 is a graph illustrating frequency characteristics of the variable-frequency filter 500 according to the eighth embodiment. The horizontal axis represents the frequency of the AC signal, and the vertical axis represents the signal pass rate. As is apparent from FIG. 14, the signal pass rate greatly increases at frequencies where the frequency component of the AC signal is equal to the spin torque resonance frequency $f_0$ of the magnetoresistive effect element 10. That is, the variable-frequency filter 500 can have a function of passing therethrough an AC signal, in the input AC signal, of a frequency component equal to the resonance frequency $f_0$ of spin precession in the magnetoresistive effect element 10, that is, a function of so-called bandpass filter.

Further, the variable-frequency filter 500 according to the eighth embodiment is capable of shifting the spin torque resonance effect to the higher frequency side or the lower frequency side by varying the exchange bias magnetic field applied to the magnetization free layer 12 from the control layer 11. That is, the variable-frequency filter 500 is capable of controlling the frequency characteristics thereof to be tunable by applying the exchange bias magnetic field to the magnetization free layer 12 from the control layer 11 so that the spin torque resonance frequency $f_0$ of magnetization in the magnetization free layer 12 becomes equal to a desired pass frequency.

For example, in the case where the frequency of the AC signal that passes through the variable-frequency filter 500 is desired to be shifted to be higher, the spin torque resonance frequency $f_0$ of the magnetization free layer 12 is successfully set to be higher by varying the exchange bias magnetic field applied to the magnetization free layer 12 from the control layer 11 so that the effective magnetic field $H_{eff}$ strengthens. As a result, the frequency of the AC signal that passes through can be set to be higher. On the other hand, in the case where the frequency of the AC signal that passes through the variable-frequency filter 500 is desired to be shifted to be lower, the spin torque resonance frequency $f_0$ of the magnetization free layer 12 is successfully set to be lower by varying the exchange bias magnetic field applied to the magnetization free layer 12 from the control layer 11 so that the effective magnetic field $H_{eff}$ weakens. As a result, the frequency of the AC signal that passes through can be set to be lower. In this way, a variable-frequency filter capable of having the best pass characteristics at a set frequency can be obtained. For example, in the case where an AC signal including a first frequency component and a second frequency component is input to the magnetoresistive effect element 10, the variable-frequency filter 500 is able to selectively pass therethrough the signal of the first frequency component of the input AC signal as illustrated in FIG. 13 by setting the spin torque resonance frequency $f_0$ of the magnetization free layer 12 to a frequency equal to the first frequency $f_1$.

The exchange bias magnetic field applied to the magnetization free layer 12 from the control layer 11 in the eighth embodiment can be set by simultaneously applying a predetermined magnetic field and a predetermined electric field to the control layer 11 respectively from the magnetic-field applying mechanism 21 and the electric-field applying mechanism 31. Further, the state of the exchange bias magnetic field that has been set can be maintained even after the applied magnetic field and electric field are removed. Thus, the resulting spin torque resonance frequency $f_0$ can be maintained even after the magnetic field and the electric field are removed. Further, even if the pass frequency shifts due to an influence of disturbance or the like after being set, the signal of the predetermined frequency can be passed through again by re-adjusting the magnitude of the exchange bias magnetic field. Thus, a state of good pass characteristics can be easily maintained even if there is an influence of disturbance or the like.

Embodiments of the present invention will be specifically described below on the basis of an experiment example and a simulation example. Note that the following description confirms the advantageous effects of the embodiments of the present invention by using an experiment example and a simulation example and does not limit the present invention. It should be noted that as long as an embodied product has the technical spirit of the present invention, the product is within the scope of the present invention.

Experiment Example

Figure 15:
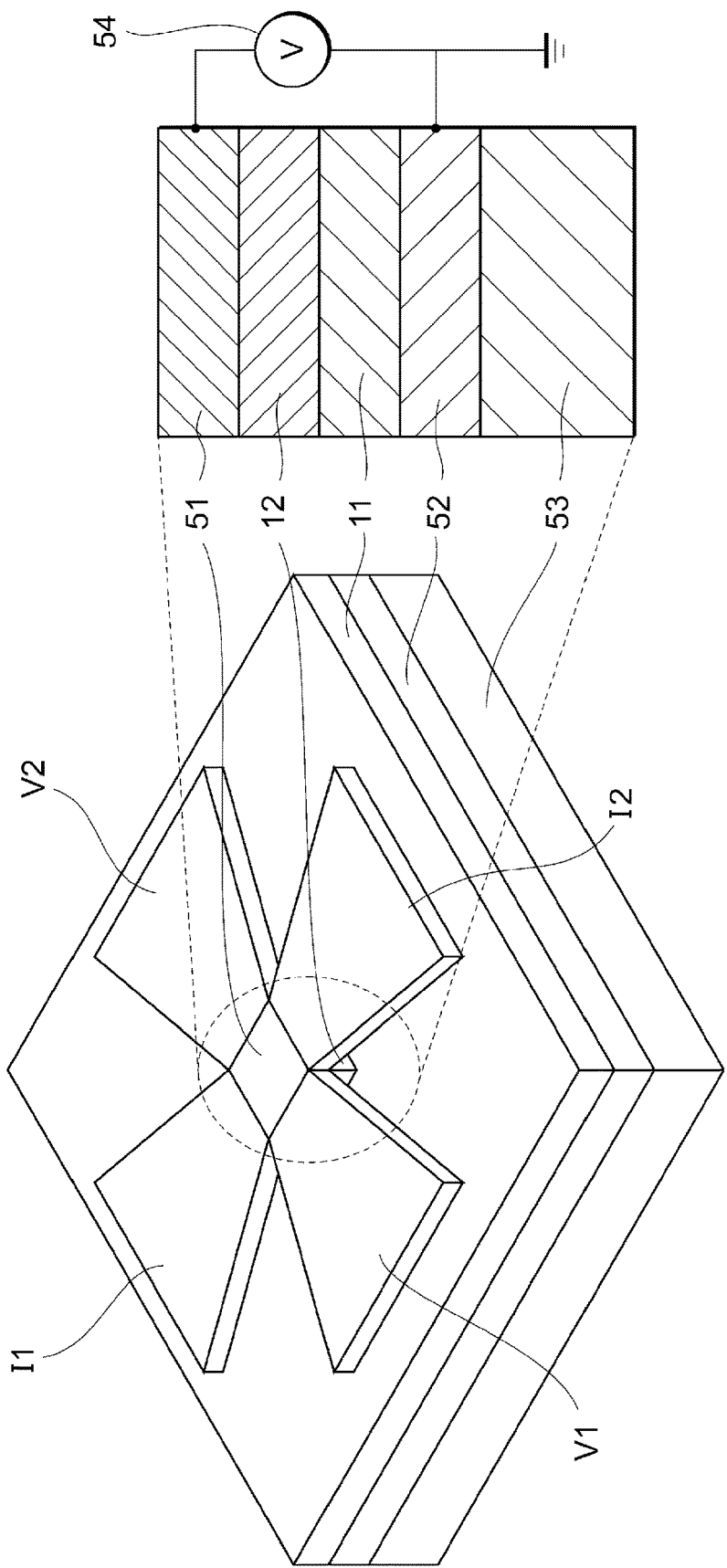
FIG. 15 is a schematic diagram illustrating a shape and a configuration of a sample according to an experiment example.

In an experiment example, a sample simulating the relationship between the control layer 11 and the magnetization free layer 12 constituting the variable-frequency magnetoresistive effect element 100 was fabricated as illustrated in FIG. 15, and advantageous effects thereof were investigated.

A configuration of the sample according to the experiment example is described with reference to FIG. 15. A substrate 53 is a sapphire substrate. A lower electrode 52 is composed of Pt. The control layer 11 is an antiferromagnetic oxide layer having the ME effect and composed of $Cr_2O_3$. The magnetization free layer 12 is a ferromagnetic metal layer composed of Co. An upper electrode 51 is composed of Pt. The upper electrode 51 and the lower electrode 52 are connected to a power supply 54 and are capable of applying a positive or negative electric field to the control layer 11 in a perpendicular direction. Thus, the upper electrode 51 and the lower electrode 52 correspond to an example of an electric-field applying mechanism according to embodiments of the present invention. In addition, a magnetic-field applying mechanism that includes an electromagnet and applies a magnetic field is provided in an up-down direction of the sample. However, since details of the magnetic-field applying mechanism are known art, a description thereof is omitted. The lower electrode 52, the control layer 11, the magnetization free layer 12, and the upper electrode 51 may be formed by using any given physical or chemical deposition process, for example, sputtering, pulsed layer deposition (PLD), ion beam deposition (IBD), or chemical vapor deposition (CVD).

Fabrication of the sample is described. The lower electrode 52 composed of Pt and having a thickness of 25 nm was formed on a step-controlled C-plane sapphire substrate by DC sputtering in an argon atmosphere.

Then, a $Cr_2O_3(001)$ layer having a thickness of 500 nm was formed on the lower electrode 52 composed of Pt by reactive RF sputtering using a metal target of Cr in an argon-oxygen atmosphere at 500° C., 0.3 Pa, and a plasma power of 100 W. The control layer 11 was composed of this $Cr_2O_3$ layer.

Then, the magnetization free layer 12 composed of a ferromagnetic metal layer of Co having a thickness of 1 nm was formed by DC sputtering in a argon atmosphere at 150° C. Further, the upper electrode 51 composed of Pt and having a thickness of 5 nm was formed on the magnetization free layer 12. In addition, in this experiment, an exchange coupling buffer layer composed of Cr and having an appropriate thickness was formed at an interface between the control layer 11 and the magnetization free layer 12 by DC sputtering in an argon atmosphere in order to adjust the magnitude of exchange coupling to an appropriate level.

An evaluation method of the obtained sample is described. The exchange bias magnetic field applied to the magnetization free layer 12 from the control layer 11 was electrically investigated using the anomalous Hall effect (AHE). To measure the anomalous Hall effect, the upper electrode 51 was shaped in a cross-like Hall bar. In addition, an intersection portion of the Hall bar shape where the magnetization free layer 12 was present was processed to have an area of 40×40 $\mu m^2$. The anomalous Hall effect was evaluated by passing a constant current between I1 and I2 of the Hall bar and measuring a Hall voltage generated across V1 and V2 at that time.

Figure 16:
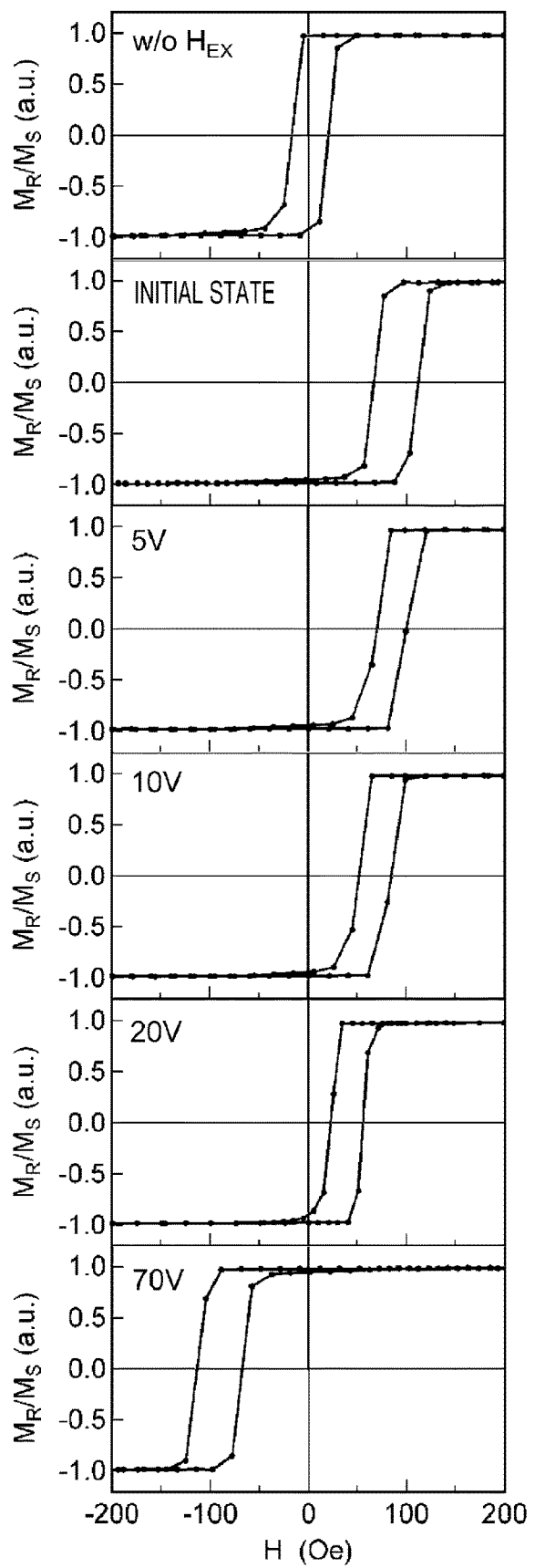
FIG. 16 is a schematic diagram illustrating how a measured result of the anomalous Hall effect varies when a voltage applied to the sample according to the experiment example is varied.

A variation in the exchange bias magnetic field in response to ME manipulation was actually investigated by using the fabricated sample. FIG. 16 is a graph illustrating a result of a measurement of the anomalous Hall effect in the fabricated sample. In FIG. 16, the vertical axis represents a normalized AHE signal, which is proportional to a direction of magnetization of the sample. A loop represented as w/o $H_{EX}$ in FIG. 16 indicates an AHE loop obtained from the magnetization free layer 12 in a state where the exchange bias magnetic field is 0. In addition, the ME manipulation experiment was performed using, as the initial state, a state where a positive exchange bias was applied to the sample by performing magnetic field cooling with a magnetic field of +10 kOe first. From the loop in the initial state, it was confirmed that the AHE loop obtained from the magnetization free layer 12 was shifted from the origin by +90 Oe. This indicates that the exchange bias magnetic field of −90 Oe is applied to the magnetization free layer 12.

In response to application of superposition of a magnetic field and an electric field to the control layer 11 of this sample so that a relationship between the magnetic field and the electric field was in a parallel state, the value of the exchange bias gradually varied from the initial state and was successfully inverted to a negative value ultimately. The experiment showed the result of AHE measurement in the case where the magnetic field was fixed to +10 kOe and an electric field was applied to the control layer 11 while gradually increasing the applied voltage. It was confirmed that the value of the exchange bias gradually reduced in response to an increase of the voltage to 5V and then 10V and that the exchange bias was completely inverted after the application of 70 V. That is, it was confirmed that the exchange bias magnetic field applied to the magnetization free layer 12 from the control layer 11 were successfully varied continuously in a range from −90 Oe to +90 Oe. Further, it was confirmed that the value of the exchange bias shifted from a negative value to a positive value when the magnetic field and the electric field were applied after the direction of the electric field was inverted so that the relationship between the magnetic field and the electric field was in an antiparallel state. That is, it was confirmed that the two states could be repeatedly switched between by switching the direction of the electric field with the direction of the magnetic field fixed. This indicates that the magnitude of the exchange bias magnetic field applied to the magnetization free layer 12 from the control layer 11 is controllable in a range from a positive value to a negative value by ME manipulation.

Simulation Example

Figure 17:
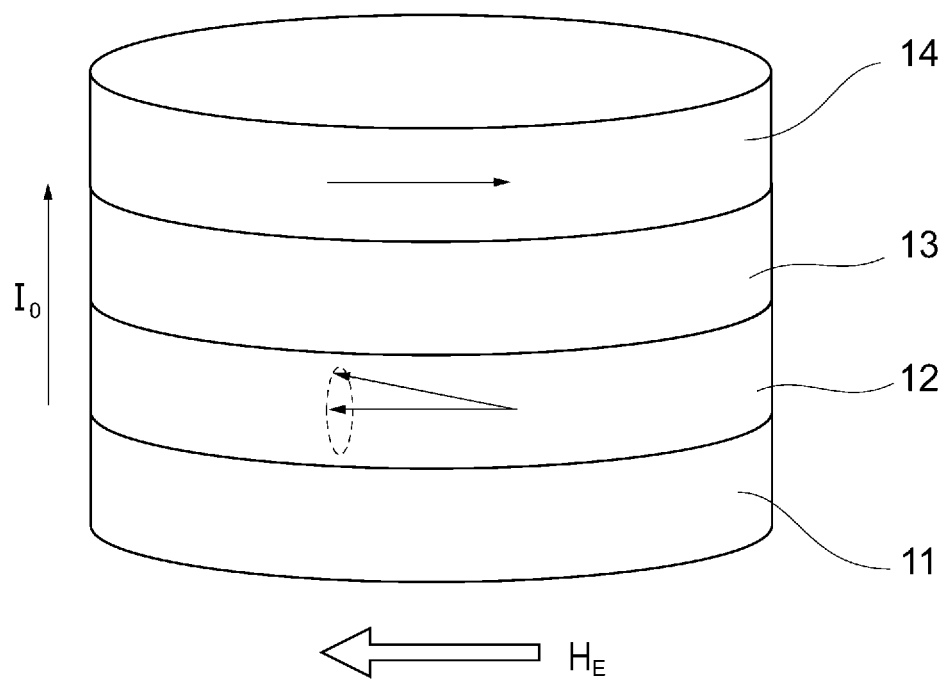
FIG. 17 is a schematic diagram illustrating a magnetoresistive effect element model according to a simulation example.

The spin torque precession effect (oscillation phenomenon, specifically) of the magnetoresistive effect element according to the first embodiment was simulated using the LLG equation. The configuration of the magnetoresistive effect element used in the simulation is described with reference to FIG. 17. The magnetization free layer 12 was configured to have a cylindrical shape with an element diameter of 170 nm. The x-axis was set to the magnetization direction of the magnetization fixed layer 14, and the z-axis direction is set to the thickness direction. A CoFe alloy was used as materials of the magnetization free layer 12 and the magnetization fixed layer 14. It was assumed that magnetization of the magnetization fixed layer 14 was fixed by exchange coupling with an antiferromagnetic material (not illustrated) adjacent to the magnetization fixed layer 14.

As the initial state of the magnetoresistive effect element 10, a state was assumed where an external magnetic field ($H_E$) of 200 Oe was applied at an angle of 179 degrees from the direction of magnetization of the magnetization fixed layer 14. In addition, since the film thickness could be considered to be sufficiently small, the demagnetizing coefficients were set such that Nx=0, Ny=0, and Nz=1.

Magnetization of the magnetization free layer 12 was assumed to be uniform. The exchange bias magnetic field applied to the magnetization free layer 12 was denoted by $H_{exc}$. In addition, in this simulation example, the anisotropic magnetic field is not taken into account for the magnetoresistive effect element 10 ($H_K$=0). Thus, the effective magnetic field in the magnetization free layer 12 was the sum of the external magnetic field $H_E$, the demagnetizing field $H_D$, and the exchange bias magnetic field $H_{EB}$ based on the exchange bias. In addition, in order to simulate oscillation at a finite temperature, $H_{thermal}$ below is added as the term of the torque based on the magnetic field in the LLG equation, in addition to the effective magnetic field. $H_{thermal}$ is represented by Equation 5.

$$|H_{thermal}| = \sqrt{\frac{2\alpha K_B T}{\mu_0 S d M_S |\gamma|} \frac{1}{dt}}$$ Equation 5

Table 1 shows parameters used in this simulation example.

TABLE 1

| Symbol | Value | Unit |
| --- | --- | --- |
| $R_{AP}$ | 100 | Ω |
| $R_P$ | 50 | Ω |
| Magnetoresistance Ratio MR | 100 | % |
| Spin Polarizability P | 0.577 | |
| Current $I_0$ | 4.5 | mA |
| RA | 1.14 | Ωμm$^2$ |
| α | 0.02 | — |
| MS | 1.31 × 10$^6$ | A/m |
| Temperature | 300 | K |

Figure 18A:
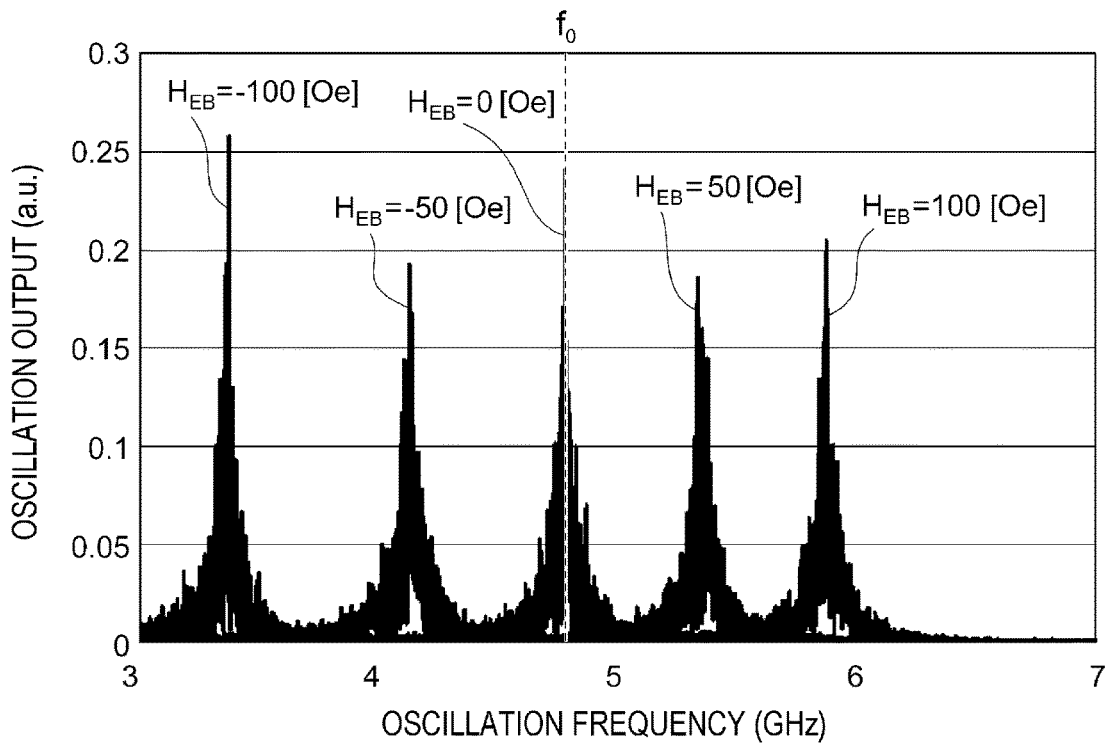
FIG. 18A is a graph illustrating a result of the simulation example.
Figure 18B:
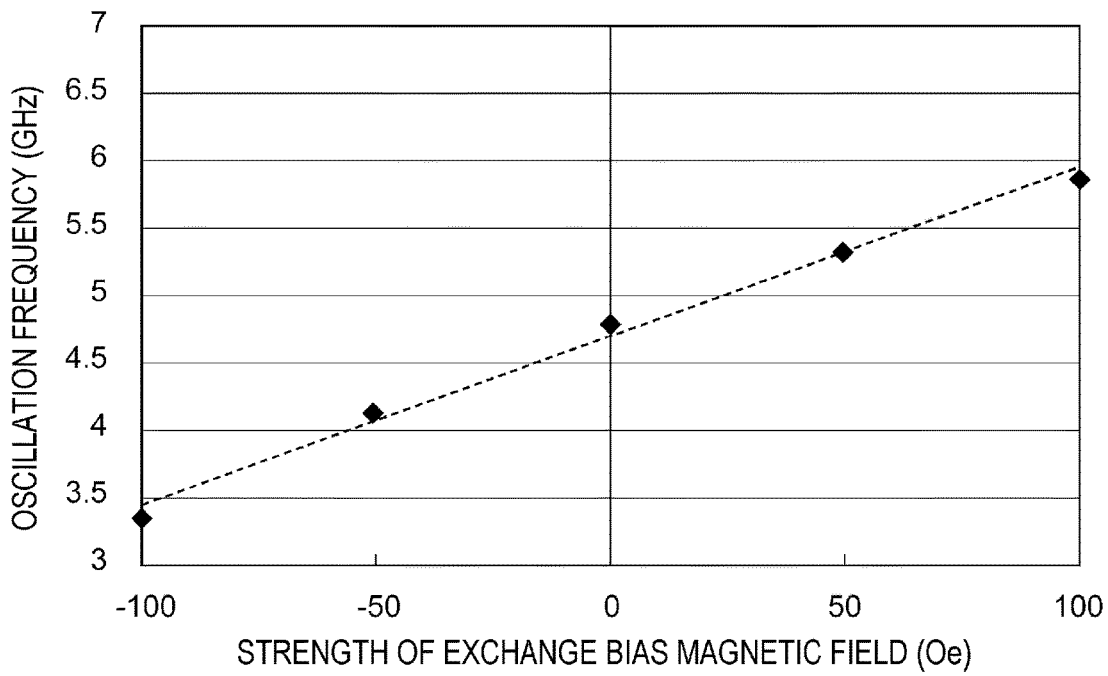
FIG. 18B is a graph obtained by plotting oscillation frequency on the vertical axis and strength of an exchange bias magnetic field on the horizontal axis.

FIG. 18A illustrates the dependence of the oscillation frequency of the magnetoresistive effect element on the exchange bias magnetic field ($H_{EB}$) determined by this simulation example. In FIG. 18A, the vertical axis represents an oscillation output in an arbitrary unit, and the horizontal axis represents the oscillation frequency. The oscillation spectrum denoted by $f_0$ in FIG. 18A indicates a reference oscillation spectrum in the case where the exchange bias magnetic field $H_{EB}$ is 0 and the effective magnetic field $H_{eff}$ is the sum of the external magnetic field $H_E$ and the demagnetizing field $H_D$. In addition, two spectra on the lower frequency side of $f_0$ respectively indicate oscillation spectra in the cases where the exchange bias magnetic field $H_{EB}$ is set to −50 Oe and −100 Oe. Further, two spectral on the higher frequency side of $f_0$ respectively indicate oscillation spectra in the cases where the exchange bias magnetic field $H_{EB}$ is set to 50 Oe and 100 Oe. FIG. 18B is a graph illustrating a relationship between the set exchange bias magnetic field $H_{EB}$ and the oscillation frequency. In FIG. 18B, the vertical axis represents the oscillation frequency, and the horizontal axis represents the strength of the exchange bias magnetic field.

As is apparent from FIG. 18A, it was confirmed that in the case where a positive exchange bias magnetic field ($H_{EB}$=50 Oe and $H_{EB}$=100 Oe in FIG. 18A) was applied, the oscillation frequency was successfully shifted to the higher frequency side without application of a magnetic field from the outside. Conversely, it was confirmed that in the case where a negative exchange bias magnetic field ($H_{EB}$=−50 Oe and $H_{EB}$=−100 Oe in FIG. 18A) was applied, the oscillation frequency was successfully shifted to the lower frequency side. That is, it was confirmed from this simulation that the frequency of spin precession is controllable by using an exchange bias magnetic field. In the simulation example, computation was performed for the case where the spin torque oscillation effect was caused in a state where a fixed external magnetic field was applied in advance by using a permanent magnet or the like and the exchange bias magnetic field was varied to vary the frequency. However, the frequency is likewise controllable even in the case where the spin torque oscillation effect is caused in a state where magnetic anisotropy is applied to the magnetization free layer instead of the external magnetic field or in the case where the spin torque oscillation effect is caused in a state where both the magnetic anisotropy and the external magnetic field are applied. In addition, although the spin torque oscillation effect was simulated in the simulation example, the similar advantageous effects can be expected for the spin torque resonance effect based on spin precession. That is, the frequency of the spin torque resonance effect is controllable by using an exchange bias magnetic field.

As described above, the variable-frequency magnetoresistive effect elements according to the embodiments of the present invention are capable of electrically controlling the frequency of spin precession in a magnetoresistive effect element and can be used in high-frequency devices, such as variable-frequency oscillators, detectors, or filters.

What is claimed is:

1. A variable-frequency magnetoresistive effect element comprising:
    a magnetoresistive effect element;
    a magnetic-field applying mechanism that applies a magnetic field to the magnetoresistive effect element;
    an electric-field applying mechanism that applies an electric field to the magnetoresistive effect element; and
    a control terminal connected to the electric-field applying mechanism and used for applying a voltage to the electric-field applying mechanism, the voltage varying in at least one of magnitude and polarity,
    wherein the magnetoresistive effect element contains an antiferromagnetic material or ferrimagnetic material having a magnetoelectric effect, and
    wherein a spin torque oscillation frequency or spin torque resonance frequency of the magnetoresistive effect element is controlled by varying the voltage applied via the control terminal in at least one of magnitude and polarity.

2. The variable-frequency magnetoresistive effect element according to claim 1,
    wherein the magnetoresistive effect element includes
        a control layer, and
        a magnetization free layer that is magnetically connected to the control layer and in which direction of magnetization is variable, and
    wherein the control layer contains the antiferromagnetic material or the ferrimagnetic material.

3. The variable-frequency magnetoresistive effect element according to claim 2, wherein the control layer further contains another antiferromagnetic material having a Neel temperature that is higher than a Neel temperature of the antiferromagnetic material or the ferrimagnetic material.

4. The variable-frequency magnetoresistive effect element according to claim 2,
    wherein the magnetization free layer has magnetic anisotropy in an in-plane direction,
    wherein a magnetic field is applied by the magnetic-field applying mechanism to the control layer in a direction perpendicular to a stacking direction of the magnetoresistive effect element,
    wherein an electric field is applied by the electric-field applying mechanism to the control layer in a direction perpendicular to the stacking direction of the magnetoresistive effect element,
    wherein the magnetic field and the electric field are superposed and applied to the control layer so as to have a substantially parallel relationship or a substantially antiparallel relationship, and wherein the spin torque oscillation frequency or the spin torque resonance frequency is varied by varying magnitude or direction of the applied electric field.

5. The variable-frequency magnetoresistive effect element according to claim 2,
wherein the magnetization free layer has magnetic anisotropy in an in-plane direction,
wherein a magnetic field is applied by the magnetic-field applying mechanism to the control layer so as to include a component of a stacking direction of the magnetoresistive effect element,
wherein an electric field is applied by the electric-field applying mechanism to the control layer so as to include a component of the stacking direction of the magnetoresistive effect element,
wherein the magnetic field and the electric field are superposed and applied to the control layer so as to have a substantially parallel relationship or a substantially antiparallel relationship, and
wherein the spin torque oscillation frequency or the spin torque resonance frequency is varied by varying magnitude or direction of the applied electric field.

6. The variable-frequency magnetoresistive effect element according to claim 2,
wherein the magnetization free layer has magnetic anisotropy in a direction perpendicular to a stacking plane,
wherein a magnetic field is applied by the magnetic-field applying mechanism to the control layer so as to include a component of the stacking direction of the magnetoresistive effect element,
wherein an electric field is applied by the electric-field applying mechanism to the control layer so as to include a component of the stacking direction of the magnetoresistive effect element,
wherein the magnetic field and the electric field are superposed and applied to the control layer so as to have a substantially parallel relationship or a substantially antiparallel relationship, and
wherein the spin torque oscillation frequency or the spin torque resonance frequency is varied by varying magnitude or direction of the applied electric field.

7. A variable-frequency detector comprising:
the variable-frequency magnetoresistive effect element according to claim 2,
wherein the spin torque resonance frequency of the magnetization free layer of the magnetoresistive effect element is varied by varying magnitude or direction of the electric field applied to the magnetoresistive effect element, and
wherein the magnetoresistive effect element receives an input AC signal and outputs a DC signal in response to a signal having a frequency equal to the spin torque resonance frequency in the input AC signal.

8. A variable-frequency filter comprising:
the variable-frequency magnetoresistive effect element according to claim 2,
wherein the spin torque resonance frequency of the magnetization free layer of the magnetoresistive effect element is varied by varying magnitude or direction of the electric field applied to the magnetoresistive effect element, and
wherein upon receiving an input AC signal, the magnetoresistive effect element outputs an AC signal obtained by attenuating a signal having a frequency equal to the spin torque resonance frequency in the input AC signal.

9. A variable-frequency filter comprising:
the variable-frequency magnetoresistive effect element according to claim 2,
wherein the spin torque resonance frequency of the magnetization free layer of the magnetoresistive effect element is varied by varying magnitude or direction of the electric field applied to the magnetoresistive effect element, and
wherein upon receiving an input AC signal, the magnetoresistive effect element selectively passes therethrough a signal having a frequency equal to the spin torque resonance frequency in the input AC signal.

10. The variable-frequency magnetoresistive effect element according to claim 1, further comprising:
a control mechanism connected to the control terminal and having a function of controlling the voltage applied via the control terminal and polarity of the voltage.

11. The variable-frequency magnetoresistive effect element according to claim 10, further comprising:
a feedback circuit that detects at least one of an input signal and an output signal of the magnetoresistive effect element and provides a feedback to the control mechanism to achieve a desired spin torque oscillation frequency or a desired spin torque resonance frequency.

12. The variable-frequency magnetoresistive effect element according to claim 1, wherein the magnetic-field applying mechanism includes a permanent magnet.

13. The variable-frequency magnetoresistive effect element according to claim 1, wherein the antiferromagnetic material includes at least one oxide selected from the group consisting of $Cr_2O_3$, $YMnO_3$, and $BiFeO_3$.

14. The variable-frequency magnetoresistive effect element according to claim 1, wherein the ferrimagnetic material includes $Al_{1-x-y}Ga_xFe_{1+y}O_3$, where $0 \leq x \leq 1$, $0 \leq y \leq 0.3$, and $0 \leq x+y \leq 1$.

15. A variable-frequency oscillator comprising:
the variable-frequency magnetoresistive effect element according to claim 1,
wherein the magnetoresistive effect element has a function of receiving an input DC signal and outputting an AC signal, and
wherein a frequency of the AC signal output from the magnetoresistive effect element is varied by varying magnitude or direction of the electric field applied to the magnetoresistive effect element.

* * * * *